United States Patent
Peng et al.

(10) Patent No.: US 9,985,192 B2
(45) Date of Patent: May 29, 2018

(54) LIGHT-EMITTING DIODE AND DISPLAY DEVICE MANUFACTURED FROM THE LIGHT-EMITTING DIODE

(71) Applicant: InnoLux Corporation, Miao-Li County (TW)

(72) Inventors: Jen-Chieh Peng, Miao-Li County (TW); Bo-Feng Chen, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days. days.

(21) Appl. No.: 15/372,556

(22) Filed: Dec. 8, 2016

(65) Prior Publication Data
US 2017/0170373 A1   Jun. 15, 2017

(30) Foreign Application Priority Data
Dec. 15, 2015   (CN) .......................... 2015 1 0931663

(51) Int. Cl.
*H01S 5/026* (2006.01)
*H01L 33/00* (2010.01)
(Continued)

(52) U.S. Cl.
CPC .......... *H01L 33/62* (2013.01); *H01L 25/0756* (2013.01); *H01L 27/124* (2013.01); *H01L 27/1248* (2013.01); *H01L 27/153* (2013.01); *H01L 33/0079* (2013.01); *H01L 33/38* (2013.01); *H01L 33/50* (2013.01); *H01L 33/504* (2013.01); *H01L 33/507* (2013.01); *H01L 33/54* (2013.01); *H01L 25/167* (2013.01); *H01L 33/08* (2013.01)

(58) Field of Classification Search
CPC .......... H01L 2924/00014; H01L 33/20; H01L 33/405; H01L 2224/051; H01L 2224/056; H01L 33/10; H01L 51/5265; H01L 2224/48091; H01L 27/156; H01L 2924/0002; H01L 33/38; H01L 33/56; H01L 33/62; H01S 5/0264; H01S 5/0425; H01S 5/0601; H01S 5/0658; H01S 5/18302; H01S 5/18308; H01S 5/18311; H01S 5/18316; H01S 5/18325; H01S 5/2063; G02F 3/026
See application file for complete search history.

(56) References Cited

U.S. PATENT DOCUMENTS 6,026,108 A * 2/2000 Lim .................. H01S 5/0264
                                                    372/28
2002/0190260 A1* 12/2002 Shen .................. H01L 33/025
                                                    257/81

* cited by examiner

*Primary Examiner* — Mary Wilczewski
*Assistant Examiner* — Tsz Chiu
(74) *Attorney, Agent, or Firm* — McClure, Qualey & Rodack, LLP

(57) ABSTRACT

A light-emitting diode is provided. The light-emitting diode includes a first semiconductor structure having an upper surface and a lower surface; a second semiconductor layer disposed adjacent to the upper surface; a third semiconductor layer disposed adjacent to the lower surface; two light-emitting layers disposed between the upper surface and the second semiconductor layer and disposed between the lower surface and the third semiconductor layer, respectively; a first electrode disposed over the second semiconductor layer; and a second electrode disposed over the third semiconductor layer.

18 Claims, 30 Drawing Sheets

(51) Int. Cl.
*H01L 33/62* (2010.01)
*H01L 27/12* (2006.01)
*H01L 33/38* (2010.01)
*H01L 33/50* (2010.01)
*H01L 33/54* (2010.01)
*H01L 25/075* (2006.01)
*H01L 27/15* (2006.01)
*H01L 25/16* (2006.01)
*H01L 33/08* (2010.01)

LIGHT-EMITTING DIODE AND DISPLAY DEVICE MANUFACTURED FROM THE LIGHT-EMITTING DIODE

CROSS REFERENCE TO RELATED APPLICATIONS

This application claims priority of China Patent Application No. 201510931663.X, filed on Dec. 15, 2015, the entirety of which is incorporated by reference herein.

BACKGROUND

Field of the Invention

The disclosure relates to a diode and a display device manufactured from the diode, and in particular to a light-emitting diode and a display device manufactured from the light-emitting diode.

Description of the Related Art

As digital technology develops, display devices are becoming more widely used in our society. For example, display devices have been applied in modern information and communication devices such as televisions, notebooks, computers, mobile phones and smartphones. In addition, each generation of display devices has been developed to be thinner, lighter, smaller, and more fashionable. These display devices include light-emitting diode display devices.

The recombination of electron and hole in the light-emitting diode may produce electromagnetic radiation (such as light) through the current at the p-n junction. For example, in the forward bias p-n junction formed by direct band gap materials such as GaAs or GaN, the recombination of electron and hole injected into the depletion region results in electromagnetic radiation. The aforementioned electromagnetic radiation may lie in the visible region or the non-visible region. Materials with different band gaps may be used to form light-emitting diodes of different colors.

Since mass production has become the tendency recently in the light-emitting diode industry, any increase in the yield of manufacturing light-emitting diodes will reduce costs and result in huge economic benefits. However, existing display devices have not been satisfactory in every respect.

Therefore, a light-emitting diode which may further increase the production yield and a display device which is manufactured from the light-emitting diode are needed.

SUMMARY

The present disclosure provides a light-emitting diode, including: a first semiconductor structure having an upper surface and a lower surface; a second semiconductor layer disposed adjacent to the upper surface; a third semiconductor layer disposed adjacent to the lower surface; two light-emitting layers disposed between the upper surface and the second semiconductor layer and disposed between the lower surface and the third semiconductor layer, respectively; a first electrode disposed over the second semiconductor layer; and a second electrode disposed over the third semiconductor layer.

The present disclosure also provides a display device, including: a thin film transistor substrate, wherein the thin film transistor substrate includes: a substrate; a thin film transistor disposed over the substrate; a common electrode disposed over the substrate; and a light-emitting diode disposed over the substrate, wherein the first semiconductor structure of the light-emitting diode is electrically connected to one of the thin film transistor and the common electrode, and the second semiconductor layer and the third semiconductor layer are electrically connected to the other one of the thin film transistor and the common electrode.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
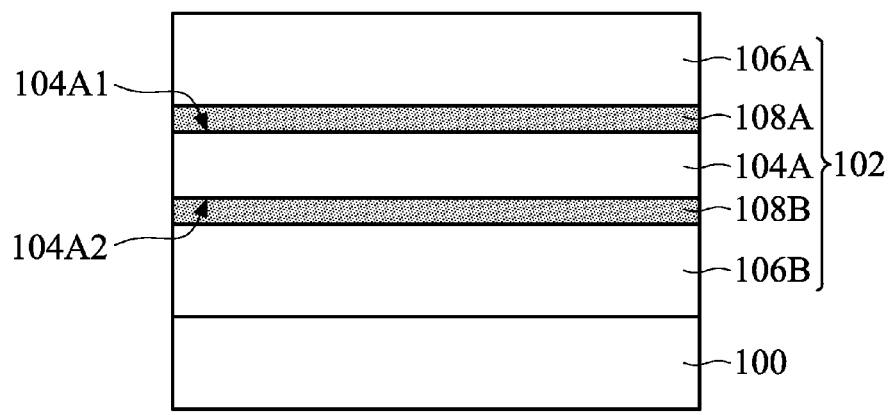
FIG. 1A is a cross-sectional view of a light-emitting diode in one of the steps of a manufacturing method of the light-emitting diode according to some embodiments of the present disclosure.

The light-emitting diode of the present disclosure and the display device manufactured from the diode are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a semiconductor wafer and the layers overlying the wafer. All semiconductor element needed may be already formed over the substrate. However, the substrate is represented with a flat surface in order to simplify the drawing. The term "substrate surface" is meant to include the uppermost exposed layers on a semiconductor wafer, such as silicon surface, and insulating layer and/or metallurgy lines.

FIG. 1A is a cross-sectional view of a light-emitting diode in one of the steps of a manufacturing method of the light-emitting diode according to some embodiments of the present disclosure. As shown in FIG. 1A, a substrate 100 is provided. The substrate 100 may include a Si substrate, a SiC substrate, a sapphire substrate (or an aluminum oxide substrate), a GaN substrate, a plastic substrate, a glass substrate or any other suitable substrates.

A stack structure 102 is disposed over the substrate 100. The stack structure 102 includes a first semiconductor layer 104A (also referred as a first semiconductor structure in this embodiment). The first semiconductor layer 104A has an upper surface 104A1 and a lower surface 104A2. A second semiconductor layer 106A is disposed adjacent to the upper surface 104A1, and a third semiconductor layer 106B is disposed adjacent to the lower surface 104A2.

In addition, the stack structure 102 further includes a light-emitting layer 108A disposed between the first semiconductor layer 104A and the second semiconductor layer 106A. The stack structure 102 further includes a light-emitting layer 108B disposed between the first semiconductor layer 104A and the third semiconductor layer 106B. In other words, the third semiconductor layer 106B, the light-emitting layer 108B, the first semiconductor layer 104A, the light-emitting layer 108A and the second semiconductor layer 106A are sequentially formed over the substrate 100.

The first semiconductor layer 104A may be a P-type semiconductor layer, and may be formed by molecular beam epitaxy (MBE), metalorganic chemical vapor deposition (MOCVD), hydride vapor phase epitaxy (HVPE), liquid phase epitaxy or any other suitable epitaxy process.

The light-emitting layers 108A and 108B may include, but is not limited to, homojunction, heterojunction, single-quantum well (SQW), multiple-quantum well (MQW) or any other suitable structures. Moreover, the light-emitting layers 108A and 108B may include a multiple-quantum well structure with multiple-quantum layers (such as InGaN) and barrier layers (such as GaN) arranged alternately. Moreover, the light-emitting layers 108A and 108B may be formed by metalorganic chemical vapor deposition (MOCVD), molecular beam epitaxy (MBE), hydride vapor phase epitaxy (HVPE), liquid phase epitaxy (LPE) or any other suitable chemical vapor deposition process. The total thickness of the light-emitting layers 108A and 108B may range from about 5 nm to 200 nm.

The second semiconductor layer 106A and the third semiconductor layer 106B may be N-type semiconductor layer, and may be formed by molecular beam epitaxy (MBE), metalorganic chemical vapor deposition (MOCVD), hydride vapor phase epitaxy (HVPE), liquid phase epitaxy or any other suitable epitaxy process.

Figure 1B:
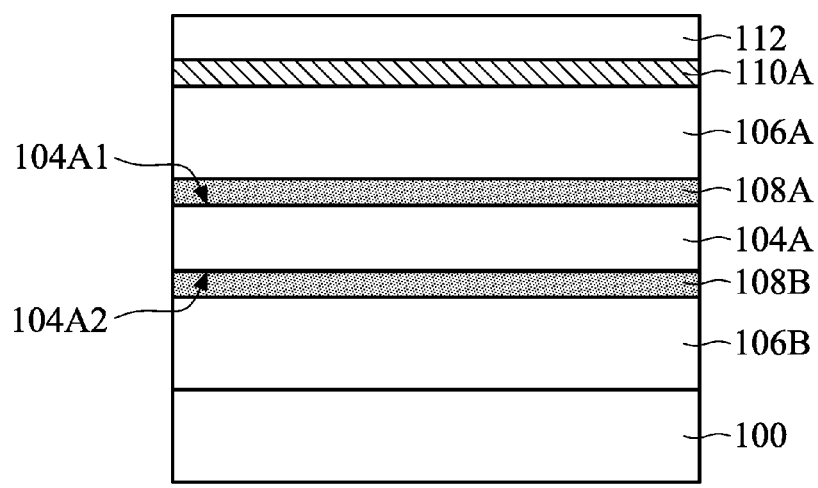
FIG. 1B is a cross-sectional view of a light-emitting diode in one of the steps of a manufacturing method of the light-emitting diode according to some embodiments of the present disclosure.

Next, FIG. 1B is a cross-sectional view of a light-emitting diode in one of the steps of a manufacturing method of the light-emitting diode according to some embodiments of the present disclosure. As shown in FIG. 1B, a first electrode 110A is formed over the second semiconductor layer 106A, and a carrier substrate 112 is disposed over the first electrode 110A. In some embodiments of the present disclosure, the carrier substrate 112 may include a metal carrier substrate.

The material of the first electrode 110A may include, but is not limited to, a single layer or multiple layers of nickel, copper, gold, indium tin oxide, indium, tin, titanium, a combination thereof, or any other metal material with good conductivity. In some embodiments of the present disclosure, the first electrode 110A may be formed by chemical vapor deposition (CVD), sputtering, resistive thermal evaporation, electron beam evaporation, or any other suitable method. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Figure 1C:
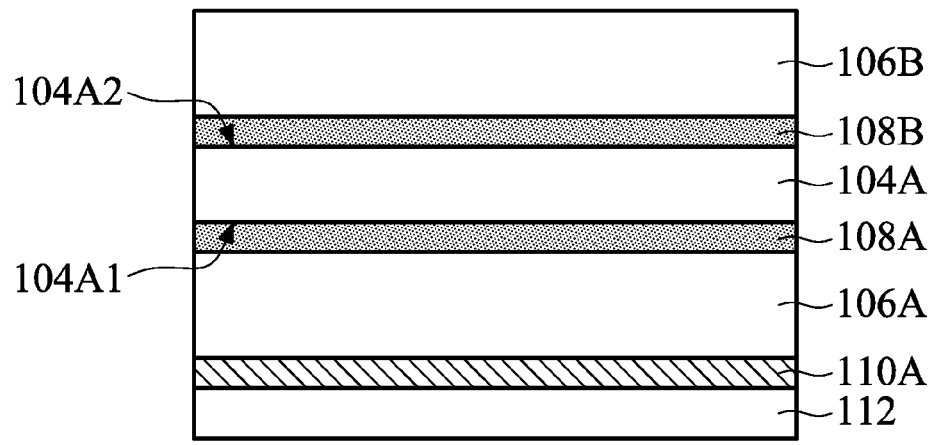
FIG. 1C is a cross-sectional view of a light-emitting diode in one of the steps of a manufacturing method of the light-emitting diode according to some embodiments of the present disclosure.

Subsequently, FIG. 1C is a cross-sectional view of a light-emitting diode in one of the steps of a manufacturing method of the light-emitting diode according to some embodiments of the present disclosure. As shown in FIG. 1C, the device shown in FIG. 1B is flipped upside down, and the substrate 100 is removed.

Figure 1D:
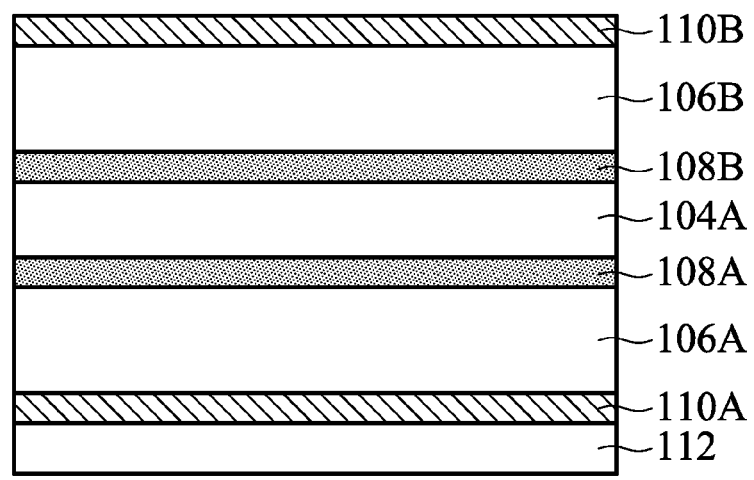
FIG. 1D is a cross-sectional view of a light-emitting diode in one of the steps of a manufacturing method of the light-emitting diode according to some embodiments of the present disclosure.

Subsequently, FIG. 1D is a cross-sectional view of a light-emitting diode in one of the steps of a manufacturing method of the light-emitting diode according to some embodiments of the present disclosure. As shown in FIG. 1D, a second electrode 110B is formed over the third semiconductor layer 106B. The material of the second electrode 110B may include, but is not limited to, a single layer or multiple layers of nickel, copper, gold, indium tin oxide, indium, tin, titanium, a combination thereof, or any other metal material with good conductivity.

Figure 1E:
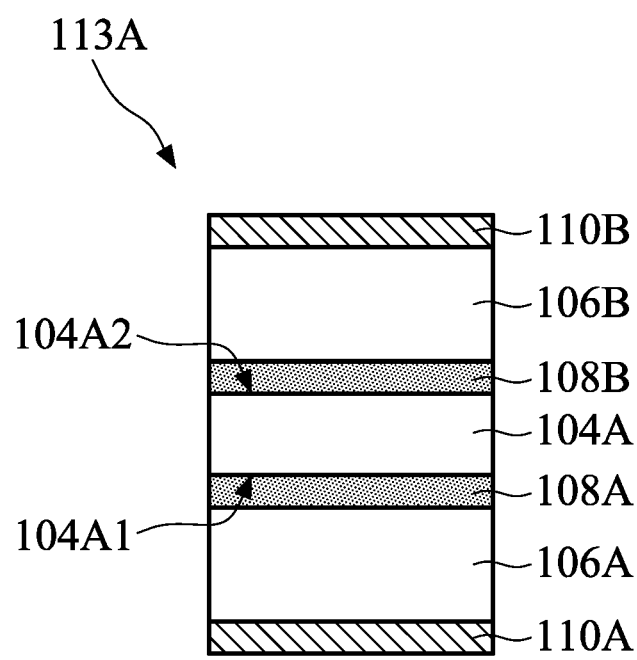
FIG. 1E is a cross-sectional view of a light-emitting diode in one of the steps of a manufacturing method of the light-emitting diode according to some embodiments of the present disclosure.

Subsequently, FIG. 1E is a cross-sectional view of a light-emitting diode in one of the steps of a manufacturing method of the light-emitting diode according to some embodiments of the present disclosure. As shown in FIG. 1E, the carrier substrate 112 is removed. A cutting or scribing process is performed to form the light-emitting diode 113A.

Still referring to FIG. 1E, the light-emitting diode 113A includes the first semiconductor layer 104A. The first semiconductor layer 104A has an upper surface 104A1 and a lower surface 104A2. The light-emitting layer 108A, the second semiconductor layer 106A, and the first electrode 110A are sequentially disposed over the upper surface 104A1. The light-emitting layer 108B, the third semiconductor layer 106B, and the second electrode 110B are sequentially disposed over the lower surface 104A2. In some embodiments of the present disclosure, the first semiconductor layer is P-type, and the second and third semiconductor layers are N-type. However, the embodiments of the present disclosure are not limited thereto as long as the conductive type of the first semiconductor layer is different from that of the second and third semiconductor layers. For example, in some other embodiments of the present disclosure, the first semiconductor layer is N-type, and the second and third semiconductor layers are P-type.

The light-emitting diode 113A may include, but is not limited to, ultraviolet light-emitting diode, white light-emitting diode, blue light-emitting diode, green light-emitting diode, red light-emitting diode, or any other suitable light-emitting diode.

Figure 1F:
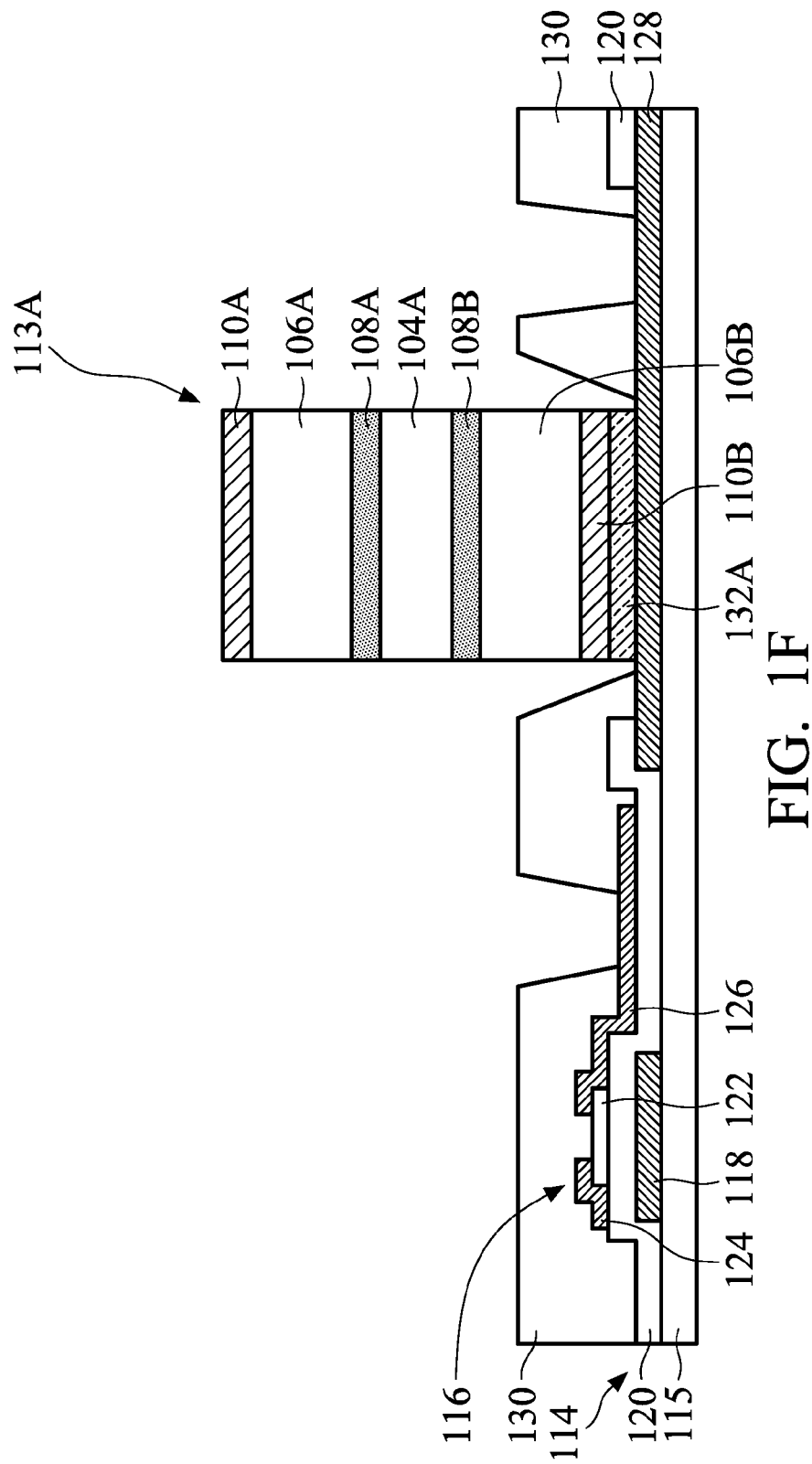
FIG. 1F is a cross-sectional view of a display device in one of the steps of a manufacturing method of the display device according to some embodiments of the present disclosure.

Subsequently, FIG. 1F is a cross-sectional view of a display device in one of the steps of a manufacturing method of the display device according to some embodiments of the present disclosure. As shown in FIG. 1F, a substrate 115 is provided. The substrate 115 may include, but is not limited to, a transparent substrate, such as a glass substrate, a ceramic substrate, a plastic substrate, or any other suitable transparent substrate. In addition, a transistor 116 which is used to control the light-emitting diode to emit light is disposed over the substrate 115. The transistor 116 may be a thin film transistor, and the substrate 115 with the transistor 116 disposed thereon may be a thin film transistor substrate 114.

The transistor 116 may have a bottom-gate-electrode type or a top-gate-electrode type. In particular, referring to FIG. 1F, the transistor 116 with the bottom-gate-electrode type may include a gate electrode 118, a gate dielectric layer 120, a semiconductor layer 122, a source electrode 124 and a drain electrode 126. The gate electrode 118 is disposed over the substrate 115. The gate dielectric layer 120 covers the gate electrode 118 and the substrate 115. The semiconductor layer 122 is disposed over the gate dielectric layer 120, and is disposed corresponding to the gate electrode 118. The source electrode 124 is disposed over the semiconductor layer 122 and overlaps with a portion of the semiconductor layer 122. The drain electrode 126 is also disposed over the semiconductor layer 122 and overlaps with another portion of the semiconductor layer 122. The top-gate-electrode type transistor 116 will not be repeated for the sake of brevity.

The material of the gate electrode 118 may include, but is not limited to, copper, aluminum, molybdenum, tungsten, gold, chromium, nickel, platinum, titanium, iridium, rhodium, an alloy thereof, a combination thereof, or any other metal material with good conductivity. In other embodiments, the material of the gate electrode 118 includes a conductive non-metal material. The material of the gate electrode 118 is not limited thereto as long as the material of the gate electrode 118 is conductive. The gate electrode 118 may be electrically connected to the gate line.

The material of the gate dielectric layer 120 may include, but is not limited to, silicon oxide, silicon nitride, silicon oxynitride, high-k material, any other suitable dielectric material, or a combination thereof. The high-k material refers to a material with a high dielectric constant and it may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, alO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, alSiO, HfTaO, HfTiO, HfTaTiO, HfAlON, $(Ba,Sr)TiO_3$(BST), $al_2O_3$, any other suitable high-k dielectric material, or a combination thereof. The gate dielectric layer 120 may be formed by chemical vapor deposition or spin-on coating. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

The semiconductor layer 122 may include an element semiconductor which may include amorphous-Si, poly-Si, germanium; a compound semiconductor which may include gallium nitride (GaN), silicon carbide, gallium arsenide, gallium phosphide, indium phosphide, indium arsenide and/or indium antimonide; an alloy semiconductor which may include SiGe alloy, GaAsP alloy, alInAs alloy, alGaAs alloy, GaInAs alloy, GaInP alloy and/or GaInAsP alloy; metal oxide which may include indium gallium zinc oxide (IGZO), indium zinc oxide (IZO), indium gallium tin zinc oxide (IGZO); an organic semiconductor which may include polycyclic aromatic compounds, or a combination thereof.

The material of the source electrode 124 and the drain electrode 126 may independently include, but is not limited to, copper, aluminum, molybdenum, tungsten, gold, chromium, nickel, platinum, titanium, iridium, rhodium, an alloy thereof, a combination thereof, or any other metal material with good conductivity. In other embodiments, the material of the source electrode 124 and the drain electrode 126 may independently include a transparent conductive material, such as ITO, IZO, IGZO, IGZTO or the like. The material of the source electrode 124 and the drain electrode 126 is not limited thereto as long as the material of the source electrode 124 and the drain electrode 126 is conductive. The source electrode 124 and the drain electrode 126 may be electrically connected to the data line.

In addition, a common electrode 128 may be further disposed over the substrate 115. The material of the common electrode 128 may include, but is not limited to, a single layer or multiple layers of nickel, copper, gold, indium tin oxide, indium, tin, titanium, a combination thereof, or any other metal material with good conductivity. In some embodiments of the present disclosure, the common electrode 128 may be formed by chemical vapor deposition (CVD), sputtering, resistive thermal evaporation, electron beam evaporation, or any other suitable method. The chemical vapor deposition may include, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), or any other suitable method.

Still referring to FIG. 1F, a patterned insulating layer 130 may be further disposed over the substrate 115. The material of the patterned insulating layer 130 may include, but is not limited to, organic insulating materials (such as photosensitive resins) or inorganic insulating materials (such as silicon nitride, silicon oxide, silicon oxynitride, silicon carbide, aluminum oxide, or a combination thereof). The patterned insulating layer 130 has two openings exposing the common electrode 128, and has an opening exposing the drain electrode 126.

Still referring to FIG. 1F, the light-emitting diode 113A is bonded to the common electrode 128 disposed over the substrate 115 through a conductive binding layer 132A. The conductive binding layer 132A is widely interpreted as a medium layer for electrically connecting any two objects. The second electrode 110B of the light-emitting diode 113A is electrically connected to the common electrode 128 through the conductive binding layer 132A. In particular, the conductive binding layer 132A is disposed between the second electrode 110B of the light-emitting diode 113A and the substrate 115 (or the common electrode 128). The material of the conductive binding layer 132A may include solder, indium, anisotropic conductive film, conductive silver glue, conductive silver paste, or any other suitable conductive binding material, or a combination thereof. In some other embodiments of the present disclosure, there is no conductive binding layer 132A disposed between the light-emitting diode 113A and the substrate 115. The second electrode 110B of the light-emitting diode 113A and the common electrode 128 disposed over the substrate 115 may be fused and bonded to each other through a metal material having low melting point with a certain temperature and pressure applied onto the second electrode 110B and the common electrode 128.

In addition, in some embodiments of the present disclosure, the conductive binding layer 132A is tin or indium, and the common electrode 128 is a double-layered structure including a nickel layer and a copper layer. The common electrode 128 is bonded to the conductive binding layer 132A by its nickel layer. In addition, the second electrode 110B is also a double-layered structure including a nickel layer and a copper layer. And the second electrode 110B is also bonded to the conductive binding layer 132A by its nickel layer. By using the specific metal material mentioned above, the device in the embodiments of the present disclosure may have excellent adhesion between layers.

Figure 1G:
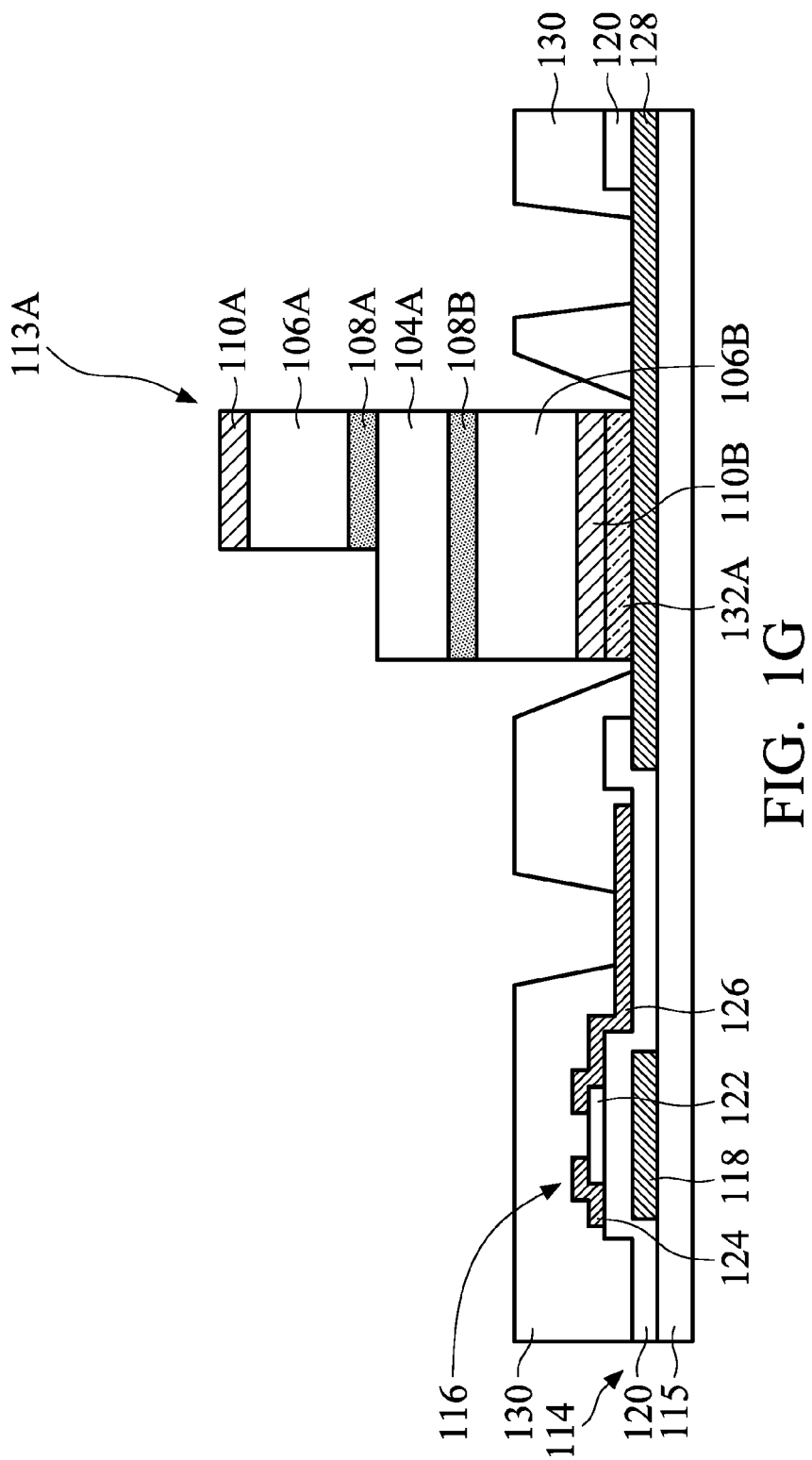
FIG. 1G is a cross-sectional view of a display device in one of the steps of a manufacturing method of the display device according to some embodiments of the present disclosure.

Subsequently, FIG. 1G is a cross-sectional view of a display device in one of the steps of a manufacturing method of the display device according to some embodiments of the present disclosure. As shown in FIG. 1G, an etching process is performed to remove a portion of the first electrode 110A, the second semiconductor layer 106A and the light-emitting layer 108A. And a portion of the first semiconductor layer 104A is exposed.

The etch process may include wet etch, dry etch, or a combination thereof. The dry etch may include, but is not limited to, capacitively coupled plasma etching, inductively-coupled plasma etching, helicon plasma etching, electron cyclotron resonance plasma etching or any other suitable dry etch process, or a combination thereof. The dry etch process employs a process gas, which may include, but is not limited to, inert gas, fluorine-containing gas, chlorine-containing gas, bromine-containing gas, iodine-containing gas, a combination thereof or any other suitable gases. In some embodiments of the present disclosure, the processing gas may include, but is not limited to, ar, $CF_4$, $SF_6$, $CH_2F_2$, $CHF_3$, $C_2F_6$, $Cl_2$, $CHCl_3$, $CCl_4$, HBr, $CHBr_3$, $BF_3$, $BCl_3$, a combination thereof or any other suitable gases.

Figure 1H:
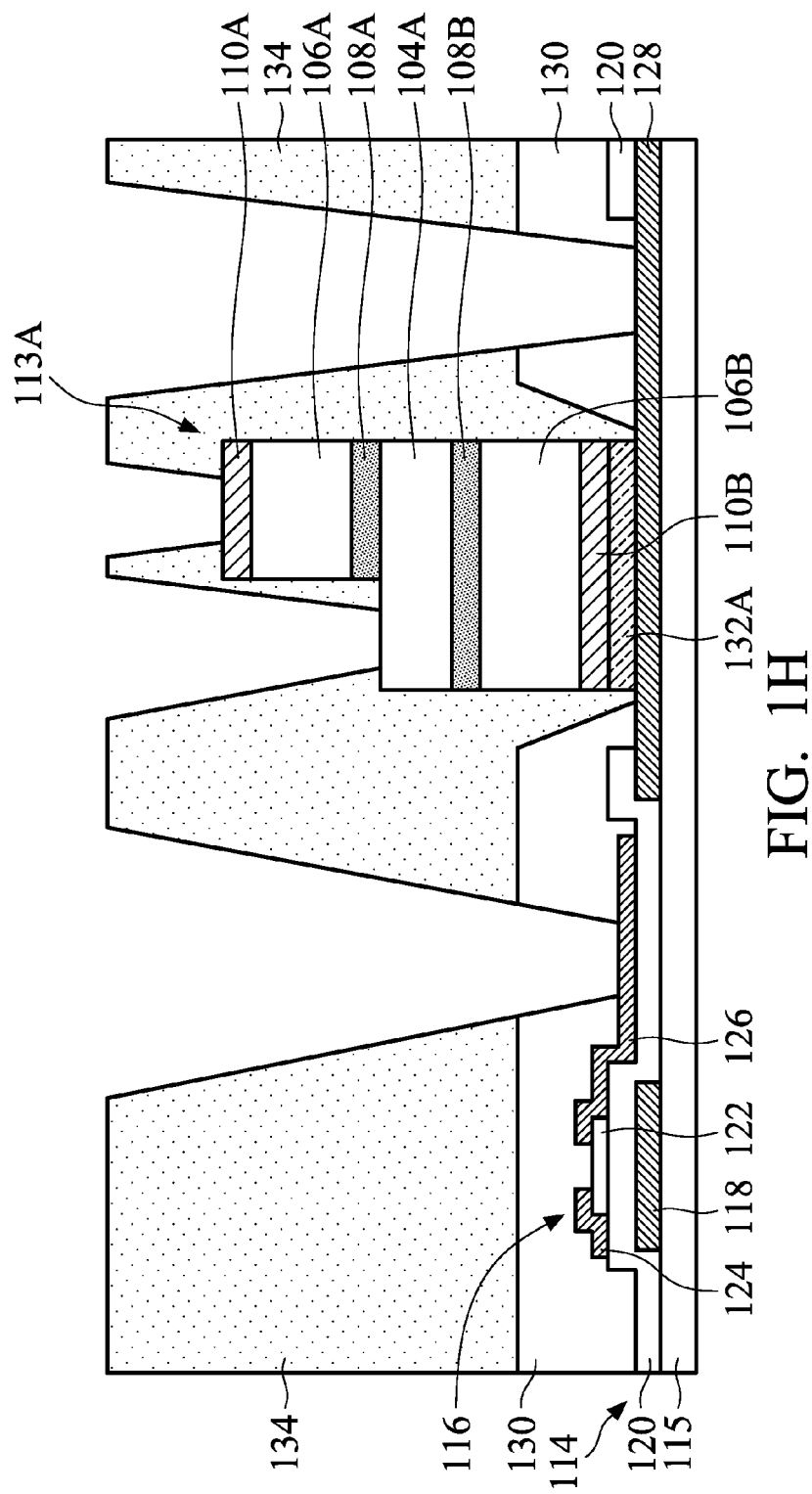
FIG. 1H is a cross-sectional view of a display device in one of the steps of a manufacturing method of the display device according to some embodiments of the present disclosure.

Subsequently, FIG. 1H is a cross-sectional view of a display device in one of the steps of a manufacturing method of the display device according to some embodiments of the present disclosure. As shown in FIG. 1H, a patterned insulating layer 134 may be formed over the light-emitting diode 113A and the substrate 115. The material of the patterned insulating layer 134 may include, but is not limited to, organic insulating materials (such as photosensitive resins) or inorganic insulating materials (such as silicon nitride, silicon oxide, silicon oxynitride, silicon carbide, aluminum oxide, or a combination thereof). The patterned insulating layer 134 has four openings respectively exposing the drain electrode 126, the first semiconductor layer 104A, the first electrode 110A and the common electrode 128.

Figure 1I:
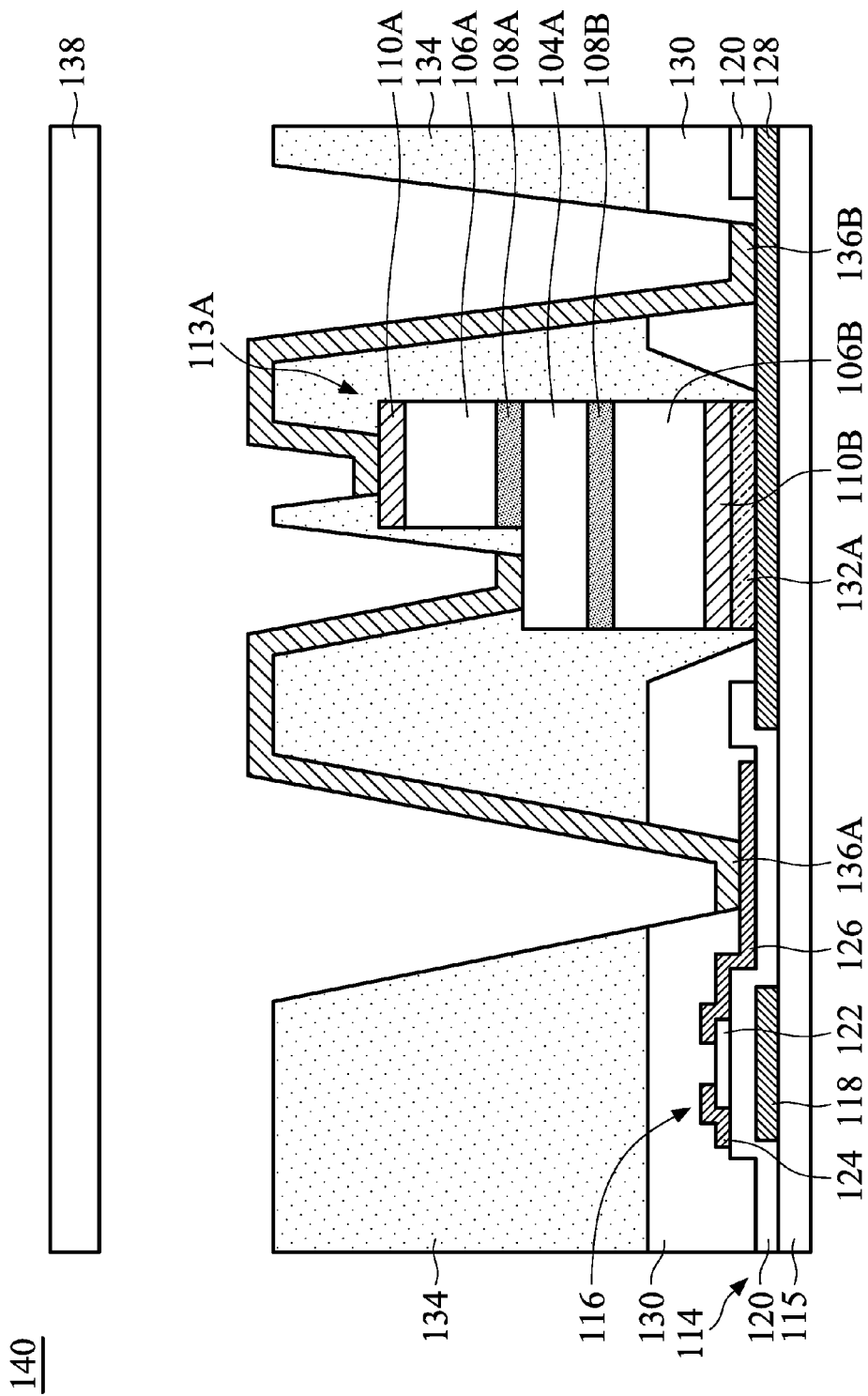
FIG. 1I is a cross-sectional view of a display device in one of the steps of a manufacturing method of the display device according to some embodiments of the present disclosure.

Subsequently, FIG. 1I is a cross-sectional view of a display device in one of the steps of a manufacturing method of the display device according to some embodiments of the present disclosure. As shown in FIG. 1I, conductive layers 136A and 136B are formed over the patterned insulating layer 134. The conductive layers 136A and 136B may independently include, but is not limited to, a single layer or multiple layers of gold, chromium, nickel, platinum, titanium, aluminum, iridium, rhodium, a combination thereof, or any other metal material with good conductivity.

Still referring to FIG. 1I, the first semiconductor layer 104A of the light-emitting diode 113A is electrically connected to either the thin film transistor 116 or the common electrode 128, and the first electrode 110A and the second electrode 110B are electrically connected to the other of the thin film transistor 116 or the common electrode 128. For example, in some embodiments of the present disclosure, as shown in FIG. 1I, the first semiconductor layer 104A of the light-emitting diode 113A is electrically connected to the drain electrode 126 of the transistor 116 through the conductive layer 136A, and the first electrode 110A of the light-emitting diode 113A is electrically connected to the common electrode 128 through the conductive layer 136B.

Referring to FIG. 1I, an opposite substrate 138 may be disposed opposite the substrate 115 to form the display device 140. The opposite substrate 138 may include, but is not limited to, a transparent substrate, such as a glass substrate, a ceramic substrate, a plastic substrate, or any other suitable transparent substrate.

Figure 1J:
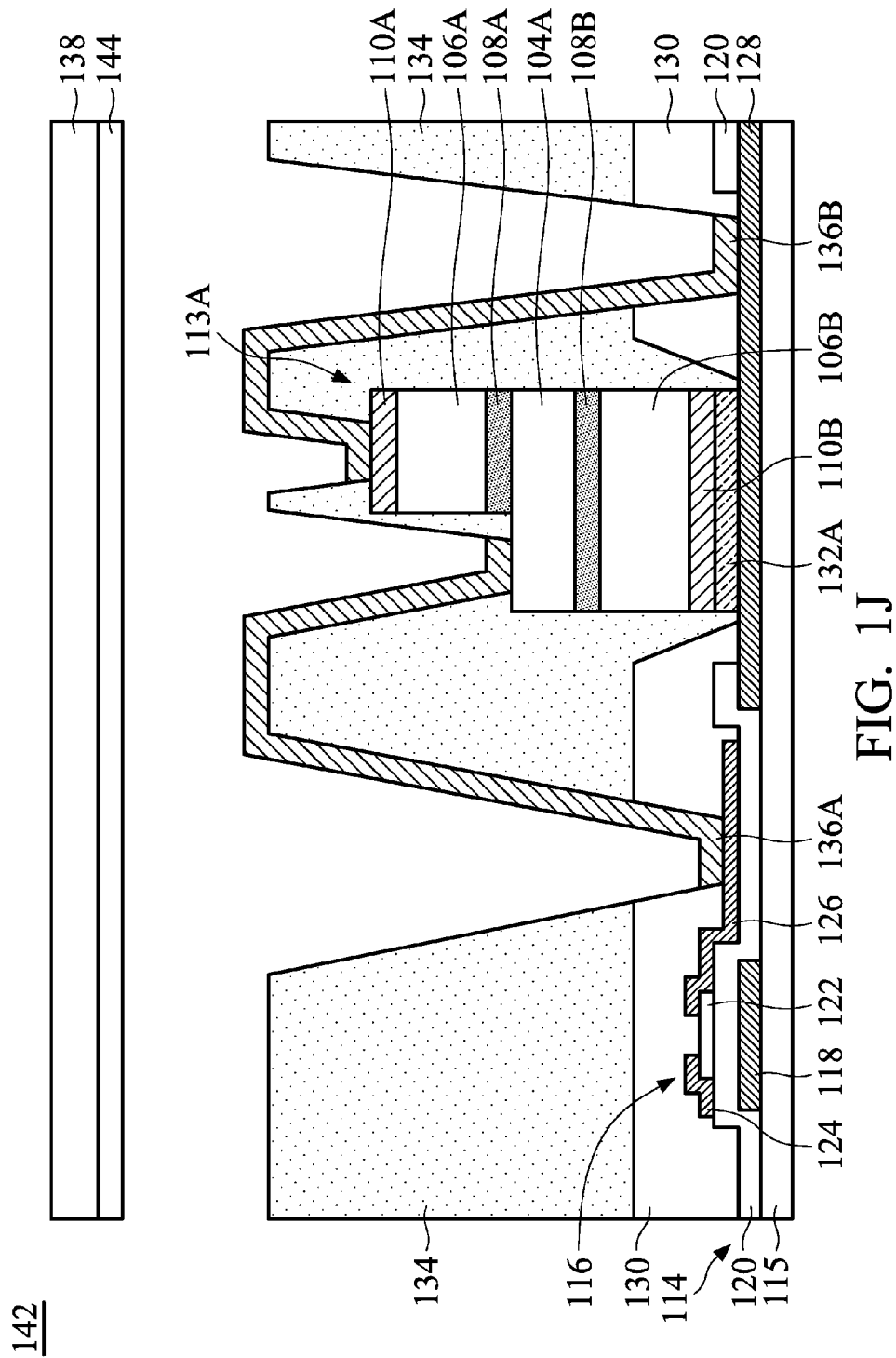
FIG. 1J is a cross-sectional view of a display device in accordance with some other embodiments of the present disclosure.

Subsequently, FIG. 1J is a cross-sectional view of a display device in accordance with some other embodiments of the present disclosure. As shown in FIG. 1J, the display device 142 further includes a color filter layer 144 disposed over the opposite substrate 138. In some embodiments of the present disclosure, the color filter layer 144 may include a blue filter layer, a red filter layer, a green filter layer, or a filter layer of any other color.

Figure 1K:
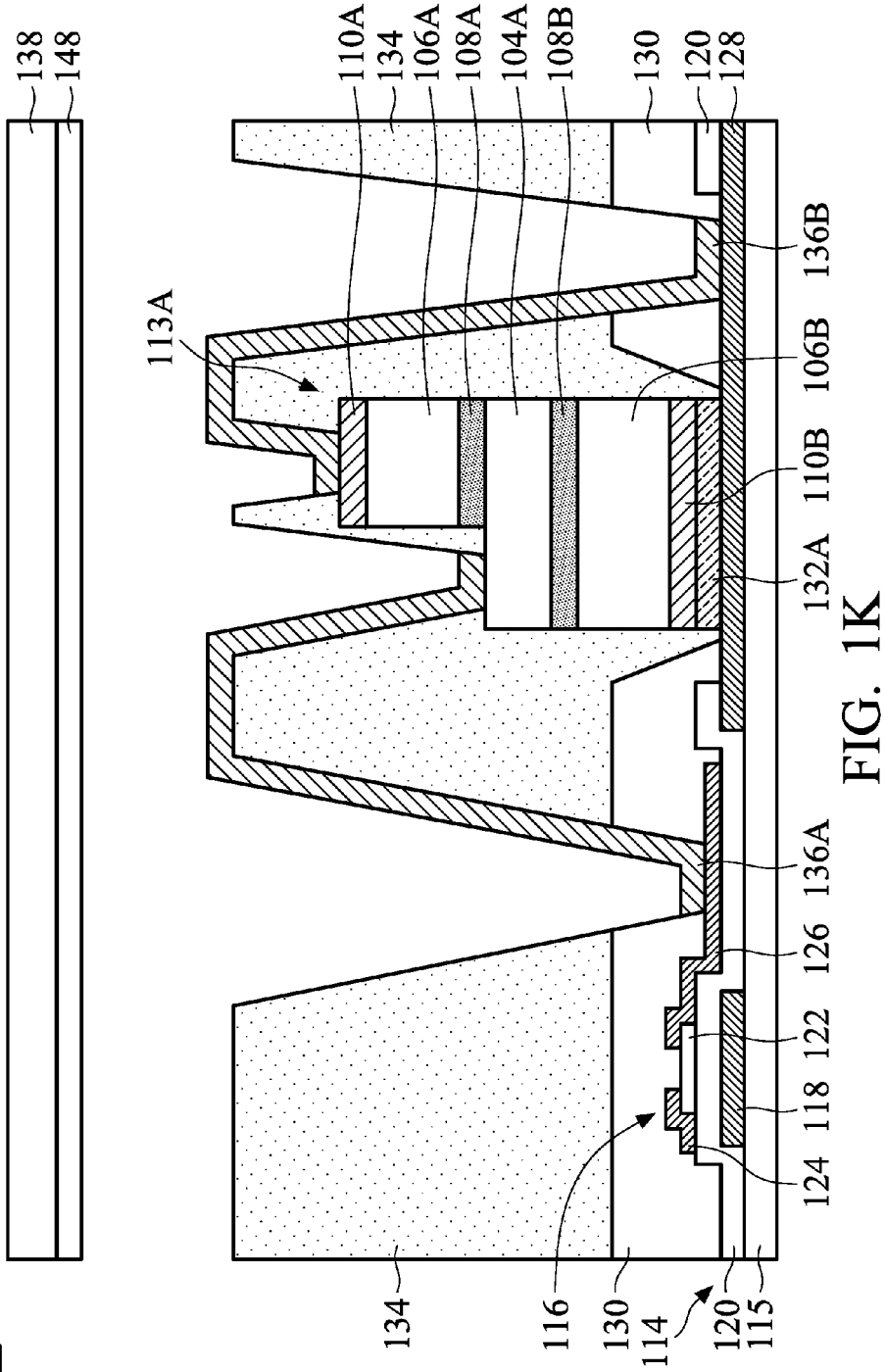
FIG. 1K is a cross-sectional view of a display device in accordance with some other embodiments of the present disclosure.

It should be noted that the exemplary embodiment set forth in FIG. 1J is merely for the purpose of illustration. In addition to the embodiment set forth in FIG. 1J, the color filter layer may be replaced with other layers, as shown in FIG. 1K. This will be described in detail in the following description. Therefore, the inventive concept and scope are not limited to the exemplary embodiment shown in FIG. 1J.

Note that the same or similar elements or layers corresponding to those of the semiconductor device are denoted by like reference numerals. The same or similar elements or layers denoted by like reference numerals have the same meaning and will not be repeated for the sake of brevity.

Subsequently, FIG. 1K is a cross-sectional view of a display device in accordance with some other embodiments of the present disclosure. As shown in FIG. 1K, the display device 146 further includes a quantum dot film 148 disposed over the opposite substrate 138.

The material of the quantum dot film 148 may include, but is not limited to, an organic layer blended with a quantum dot or an inorganic layer blended with a quantum dot. The quantum dot may be a nano three-dimensional structure including zinc, cadmium, selenium, sulfur, or a combination thereof. The grain diameter of the quantum dot may range from about 1 nm-10 nm. By tuning the grain diameter of the quantum dot, the spectrum of light resulting from the excitation of the quantum dot film 148 by the light source (for example, blue light with a wavelength ranging from about 380~500 nm) may be altered. For example, the first quantum dot film blended with the quantum dot having the first grain diameter may emit light of a first color after excitation by blue light. The second quantum dot film blended with the quantum dot having the second grain diameter may emit light of a second color after excitation by blue light. The third quantum dot film blended with the quantum dot having the third grain diameter may emit light of a third color after excitation by blue light. Light of the first color, second color, and third color may each have a different spectrum.

Figure 1L:
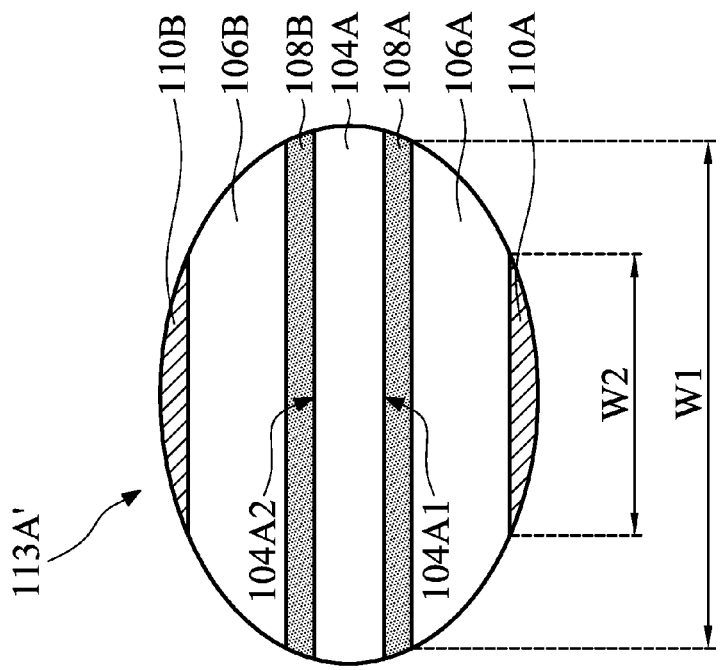
FIG. 1L is a cross-sectional view of a light-emitting diode in accordance with some other embodiments of the present disclosure.
Figure 1M:
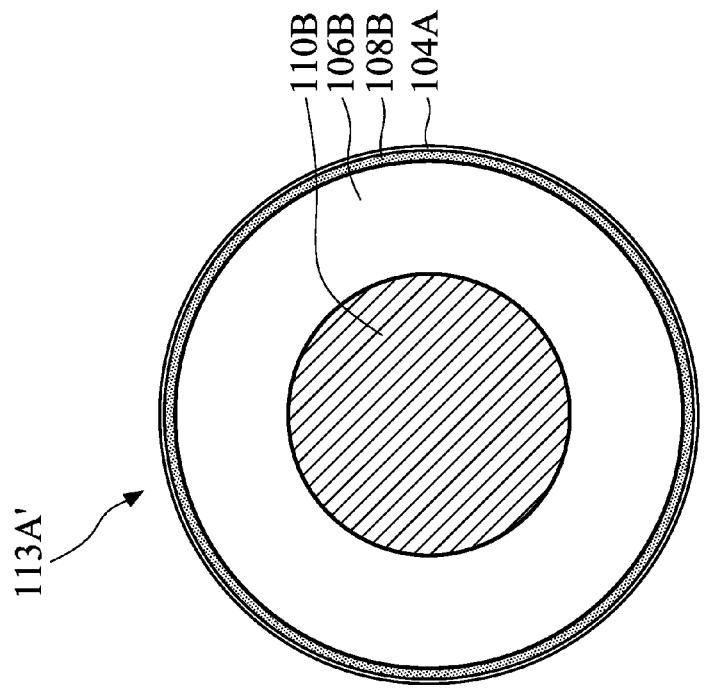
FIG. 1M is a top view of a light-emitting diode in accordance with some other embodiments of the present disclosure.

It should be noted that the exemplary embodiment set forth in FIGS. 1A-1K is merely for the purpose of illustration. In addition to the embodiment set forth in FIGS. 1A-1K, the light-emitting diode of the present disclosure may have other structure, as shown in FIGS. 1L-1M. This will be described in detail in the following description. Therefore, the inventive concept and scope are not limited to the exemplary embodiment shown in FIGS. 1A-1K.

Subsequently, FIG. 1L is a cross-sectional view of a light-emitting diode in accordance with some other embodiments of the present disclosure. FIG. 1M is the top view of the light-emitting diode shown in FIG. 1L. As shown in FIGS. 1L-1M, the light-emitting diode 113A' has an oval cross-section shape. In other words, when viewed from a cross-sectional view crossing the upper surface 104A1 and the lower surface 104A2, the second semiconductor layer 106A has an edge adjacent to the upper surface 104A1 and the edge having a first width W1, and the second semiconductor layer 106A has an edge adjacent to the first electrode 110A and the edge having a second width W2. The first width W1 is greater than the second width W2. The third semiconductor layer 106B has a shape similar to that of the second semiconductor layer 106A and will not be repeated for the sake of brevity. In other words, the cross-section of the light-emitting diode 113A' has curvature altering with the height. In some embodiments of the present disclosure, the light-emitting diode 113A' having the oval cross-section shape may be formed by an etching step. The oval cross-section shape may have the light-emitting diode 113A' tend to situate at the orientation shown in FIG. 1L in the manufacturing process. Therefore, the yield of the display device may be increased.

It should be noted that the exemplary embodiment set forth in FIGS. 1A-1M is merely for the purpose of illustration. In addition to the embodiment set forth in FIGS. 1A-1M, the light-emitting diode of the present disclosure may have other structure, as shown in FIGS. 2A-2H. This will be described in detail in the following description. Therefore, the inventive concept and scope are not limited to the exemplary embodiment shown in FIGS. 1A-1M.

Note that the same or similar elements or layers corresponding to those of the semiconductor device are denoted by like reference numerals. The same or similar elements or layers denoted by like reference numerals have the same meaning and will not be repeated for the sake of brevity.

Figure 2A:
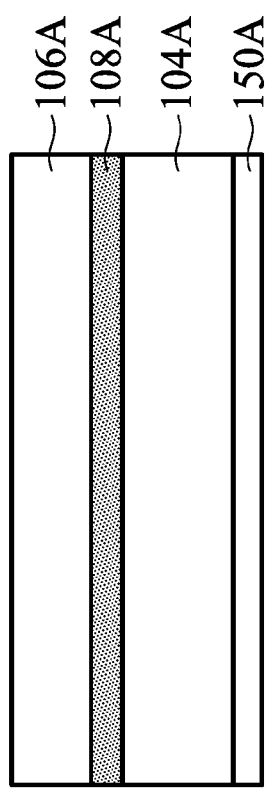
FIG. 2A is a cross-sectional view of a light-emitting diode in one of the steps of a manufacturing method of the light-emitting diode according to some embodiments of the present disclosure.

Subsequently, FIG. 2A is a cross-sectional view of a light-emitting diode in one of the steps of a manufacturing method of the light-emitting diode according to some embodiments of the present disclosure. As shown in FIG. 2A, the first semiconductor layer 104A, the light-emitting layer 108A and the second semiconductor layer 106A are sequentially formed over the first sub-substrate 150A. The first sub-substrate 150A may be a conductive substrate such as a silicon carbide substrate. In some embodiments of the present disclosure, the first semiconductor layer 104A has the first conductive type, and the second semiconductor layer 106A has the second conductive type. In some embodiments of the present disclosure, the first conductive type is N-type, and the second conductive type is P-type. However, the embodiments of the present disclosure are not limited thereto as long as the second conductive type is different from the first conductive type. For example, in some other embodiments of the present disclosure, the first conductive type is P-type, and the second conductive type is N-type.

Figure 2B:
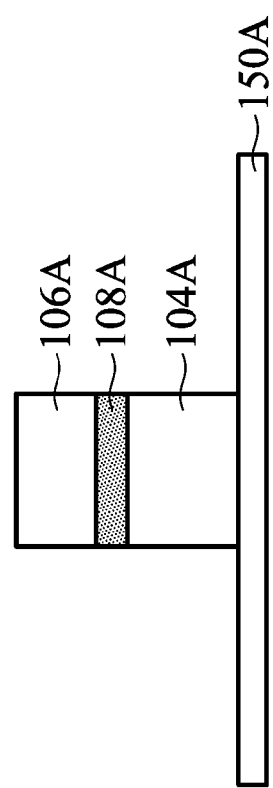
FIG. 2B is a cross-sectional view of a light-emitting diode in one of the steps of a manufacturing method of the light-emitting diode according to some embodiments of the present disclosure.

Subsequently, FIG. 2B is a cross-sectional view of a light-emitting diode in one of the steps of a manufacturing method of the light-emitting diode according to some embodiments of the present disclosure. As shown in FIG. 2B, an etching step is performed to remove a portion of the first semiconductor layer 104A, the light-emitting layer 108A and the second semiconductor layer 106A. In addition, the first sub-substrate 150A is exposed.

Figure 2C:
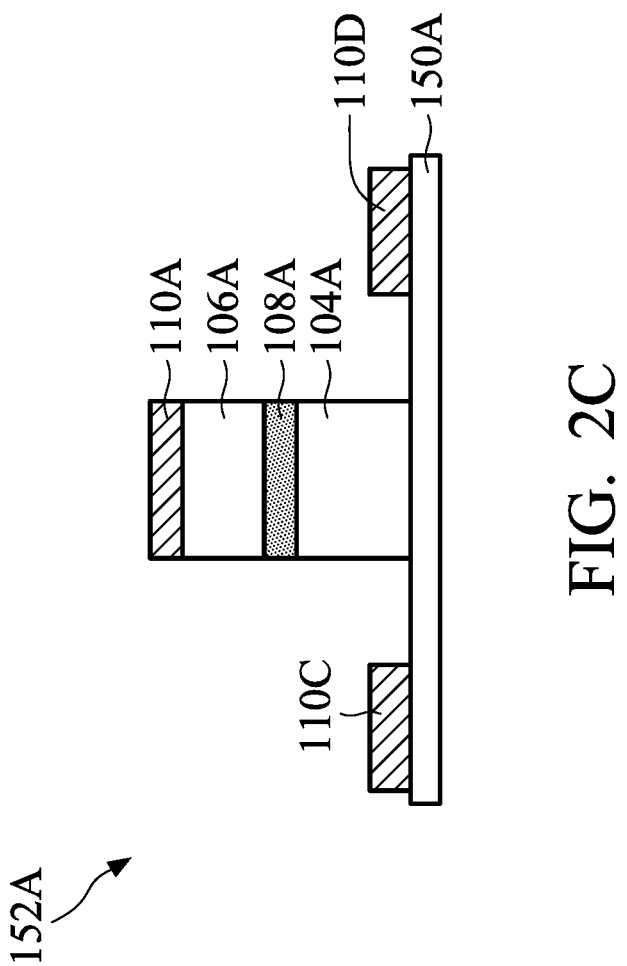
FIG. 2C is a cross-sectional view of a light-emitting diode in one of the steps of a manufacturing method of the light-emitting diode according to some embodiments of the present disclosure.

Subsequently, FIG. 2C is a cross-sectional view of a light-emitting diode in one of the steps of a manufacturing method of the light-emitting diode according to some embodiments of the present disclosure. As shown in FIG. 2C, a first electrode 110A is formed over the second semiconductor layer 106A, and two third electrodes 110C and 110D are formed adjacent to a surface of the first sub-substrate 150A to form a light-emitting unit 152A. The two third electrodes 110C and 110D are disposed at two opposite sides of the first semiconductor layer 104A, respectively. In some embodiments of the present disclosure, the two third electrodes 110C and 110D are two cross-sectional portions in one cross-sectional view of the circular third electrode 110. The material of the third electrode 110 may include, but is not limited to, a single layer or multiple layers of nickel, copper, gold, indium tin oxide, indium, tin, titanium, a combination thereof, or any other metal material with good conductivity.

Figure 2D:
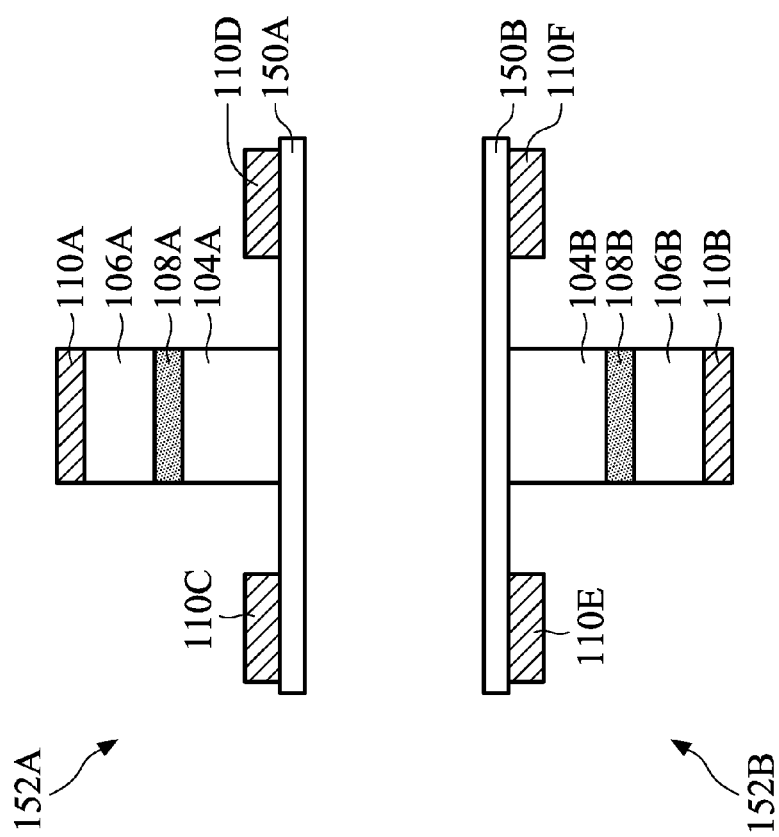
FIG. 2D is a cross-sectional view of a light-emitting diode in one of the steps of a manufacturing method of the light-emitting diode according to some embodiments of the present disclosure.
Figure 2E:
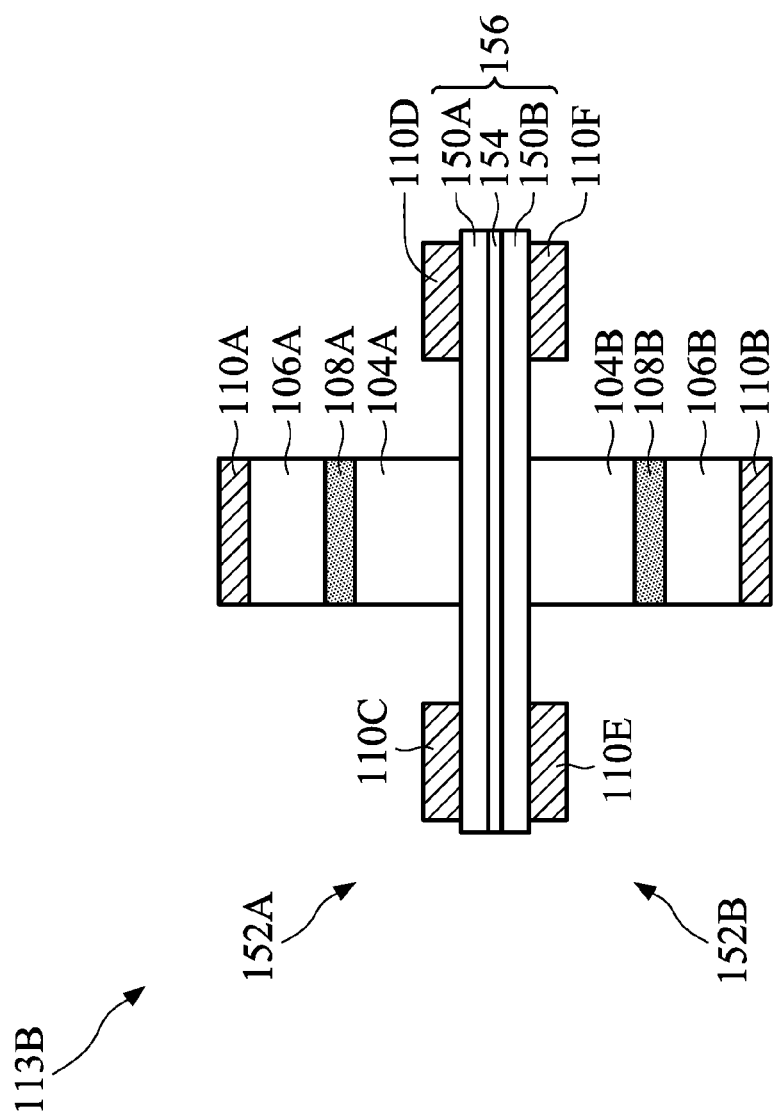
FIG. 2E is a cross-sectional view of a light-emitting diode in one of the steps of a manufacturing method of the light-emitting diode according to some embodiments of the present disclosure.

Subsequently, FIG. 2D is a cross-sectional view of a light-emitting diode in one of the steps of a manufacturing method of the light-emitting diode according to some embodiments of the present disclosure, and FIG. 2E is a cross-sectional view of a light-emitting diode in one of the steps of a manufacturing method of the light-emitting diode according to some embodiments of the present disclosure. As shown in FIG. 2D, another light-emitting unit 152B is provided. The structure of the light-emitting unit 152B is similar to the structure of the light-emitting unit 152A. The light-emitting unit 152B also includes a second sub-substrate 150B. A second semiconductor layer 104B, a light-emitting layer 108B, a third semiconductor layer 106B and the second electrode 110B are sequentially formed over the second sub-substrate 150B. In addition, two third electrodes 110E and 110F are also disposed adjacent to a surface of the second sub-substrate 150B. The two third electrodes 110E and 110F are disposed at two opposite sides of the second semiconductor layer 104B, respectively. In some embodiments of the present disclosure, the two third electrodes 110E and 110F are two cross-sectional portions in one cross-sectional view of the circular third electrode 110.

Next, as shown in FIG. 2E, the light-emitting unit 152A is bonded to the light-emitting unit 152B with the two sub-substrates 150A and 150B being opposite to each other to form a light-emitting diode 113B. The first sub-substrate 150A is bonded to the second sub-substrate 150B through a conductive adhesive layer 154 to form a substrate 156. In other words, the substrate 156 includes the second sub-substrate 150B, the conductive adhesive layer 154 disposed over the second sub-substrate 150B, and the first sub-substrate 150A disposed over the conductive adhesive layer 154. In some embodiments of the present disclosure, the conductive adhesive layer 154 may include copper-tin alloy. In addition, in this embodiment, the substrate 156 (for example, a conductive substrate), the first semiconductor layer 104A and the second semiconductor layer 104B are collectively referred to as a first semiconductor structure. And the two semiconductor layers 104A, 104B are disposed adjacent to two opposite surfaces of the substrate 156.

In some other embodiments of the present disclosure, the first sub-substrate 150A and the second sub-substrate 150B may independently be a buffer layer disposed over a substrate for epitaxial growth. The material of the substrate may include, but is not limited to, non-metal material or metal material. The metal material may include, but is not limited to, copper, aluminum, tungsten, gold, chromium, nickel, platinum, titanium, iridium, rhodium, indium, tin, an alloy thereof, a combination thereof, or any other metal material with good conductivity. If the material of the substrate is metal having low melting point, by applying a certain temperature and pressure onto the first sub-substrate 150A and the second sub-substrate 150B, the first sub-substrate 150A and the second sub-substrate 150B may be fused and bonded to each other to form a conductive substrate.

Figure 2F:
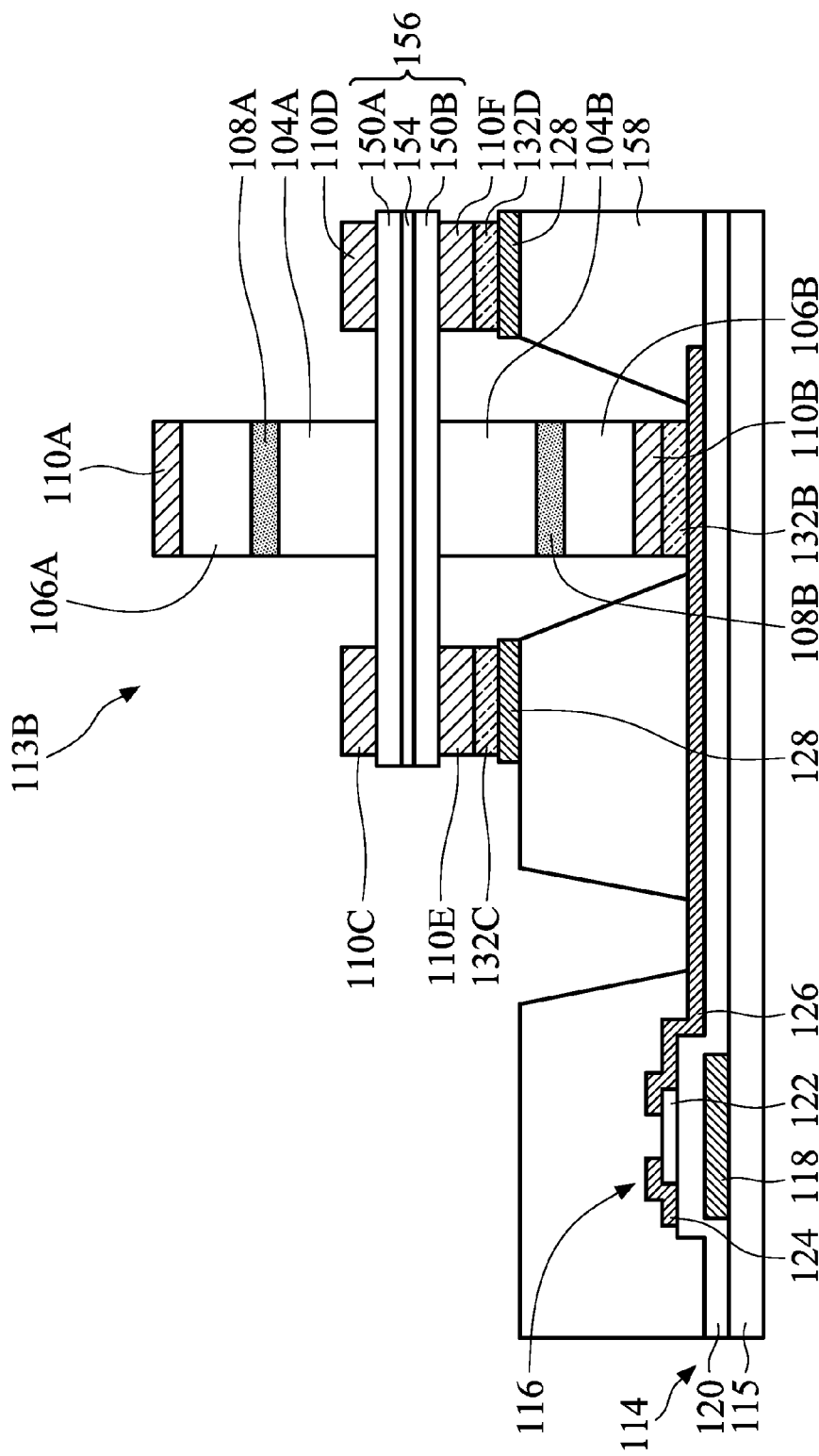
FIG. 2F is a cross-sectional view of a display device in one of the steps of a manufacturing method of the display device according to some embodiments of the present disclosure.

Subsequently, FIG. 2F is a cross-sectional view of a display device in one of the steps of a manufacturing method of the display device according to some embodiments of the present disclosure. As shown in FIG. 2F, a substrate 115 is provided. A transistor 116 which is used to control the light-emitting diode to emit light is disposed over the substrate 115. The substrate 115 with the transistor 116 disposed thereon may be a thin film transistor substrate 114.

A patterned insulating layer 158 may be further disposed over the substrate 115. The material of the patterned insulating layer 158 may include, but is not limited to, organic insulating materials (such as photosensitive resins) or inorganic insulating materials (such as silicon nitride, silicon oxide, silicon oxynitride, silicon carbide, aluminum oxide, or a combination thereof). The patterned insulating layer 158 has two openings exposing the drain electrode 126.

The second electrode 110B of the light-emitting diode 113B is electrically connected to the drain electrode 126 of the substrate 115 through the conductive binding layer 132B. In particular, the conductive binding layer 132B is disposed between the second electrode 110B of the light-emitting diode 113B and the substrate 115 (or the drain electrode 126). The material of the conductive binding layer 132B may include solder, indium, anisotropic conductive film, conductive silver glue, or any other suitable conductive binding material, or a combination thereof.

In addition, the two third electrodes 110E and 110F are bonded to the common electrode 128 through the conductive binding layers 132C and 132D, respectively. The first semiconductor layer 104A and the second semiconductor layer 104B are electrically connected to the common electrode 128 through the conductive substrate 156, the third electrodes 110E and 110F, and the conductive binding layers 132C and 132D. The common electrode 128 may be electrically connected to other electrodes or electric wires through a conductive via or any other structure.

In addition, in some embodiments of the present disclosure, the conductive binding layers 132B, 132C and 132D are tin or indium. The drain electrode 126 and the common electrode 128 are multi-layered structures respectively, for example either of them is a double-layered structure including a nickel layer and a copper layer. The drain electrode 126 and common electrode 128 are bonded to the conductive binding layer 132B, 132C and 132D by its nickel layer. In addition, the second electrode 110B and the third electrode 110E and 110F are also double-layered structures including a nickel layer and a copper layer. And the second electrode 110B and the third electrode 110E and 110F are also bonded to the conductive binding layer 132B, 132C and 132D by its nickel layer. By using the specific metal material mentioned above, the device in the embodiments of the present disclosure may have excellent adhesion between layers.

However, in some other embodiments of the present disclosure, there is no conductive binding layer 132B disposed between the light-emitting diode 113B and the substrate 115. The second electrode 110B of the light-emitting diode 113B and the drain electrode 126 disposed over the substrate 115 may be metal with a low melting point. The second electrode 110B of the light-emitting diode 113B and the drain electrode 126 disposed over the substrate 115 may be fused and bonded to each other by applying a certain temperature and pressure onto the second electrode 110B and the drain electrode 126. In some other embodiments of the present disclosure, there are no conductive binding layers 132C and 132D disposed between the third electrodes 110E and 110F and the common electrode 128. The third electrodes 110E and 110F and the common electrode 128 may be metal with a low melting point. The third electrodes 110E and 110F and the common electrode 128 may be fused and bonded to each other by applying a certain temperature and pressure onto the third electrodes 110E and 110F and the common electrode 128.

Figure 2G:
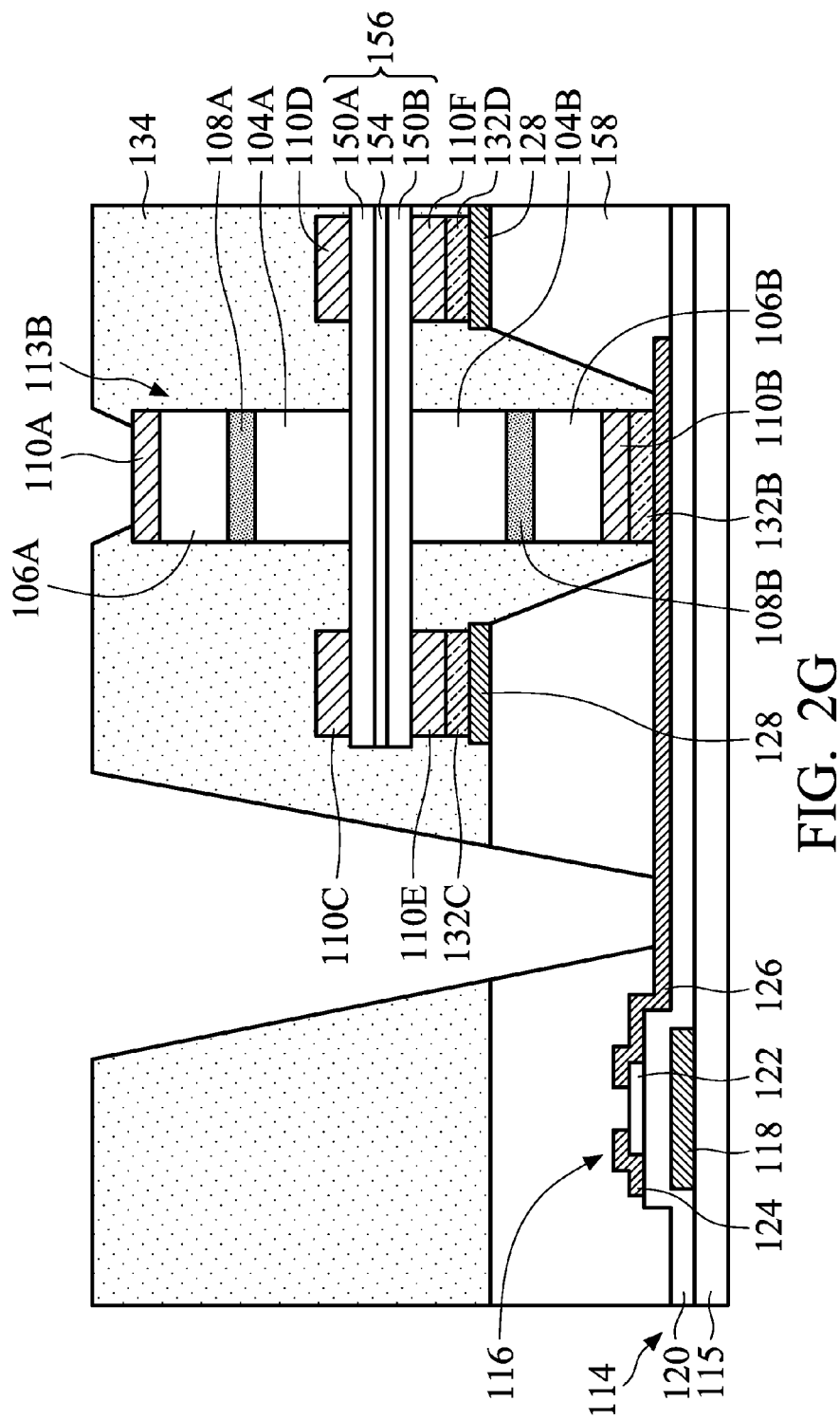
FIG. 2G is a cross-sectional view of a display device in one of the steps of a manufacturing method of the display device according to some embodiments of the present disclosure.

Subsequently, FIG. 2G is a cross-sectional view of a display device in one of the steps of a manufacturing method of the display device according to some embodiments of the present disclosure. As shown in FIG. 2G, a patterned insulating layer 134 may be formed over the light-emitting diode 113B and the thin film transistor substrate 114. The material of the patterned insulating layer 134 may include, but is not limited to, organic insulating materials (such as photosensitive resins) or inorganic insulating materials (such as silicon nitride, silicon oxide, silicon oxynitride, silicon carbide, aluminum oxide, or a combination thereof). The patterned insulating layer 134 has two openings respectively exposing the first electrode 110A and the drain electrode 126.

Figure 2H:
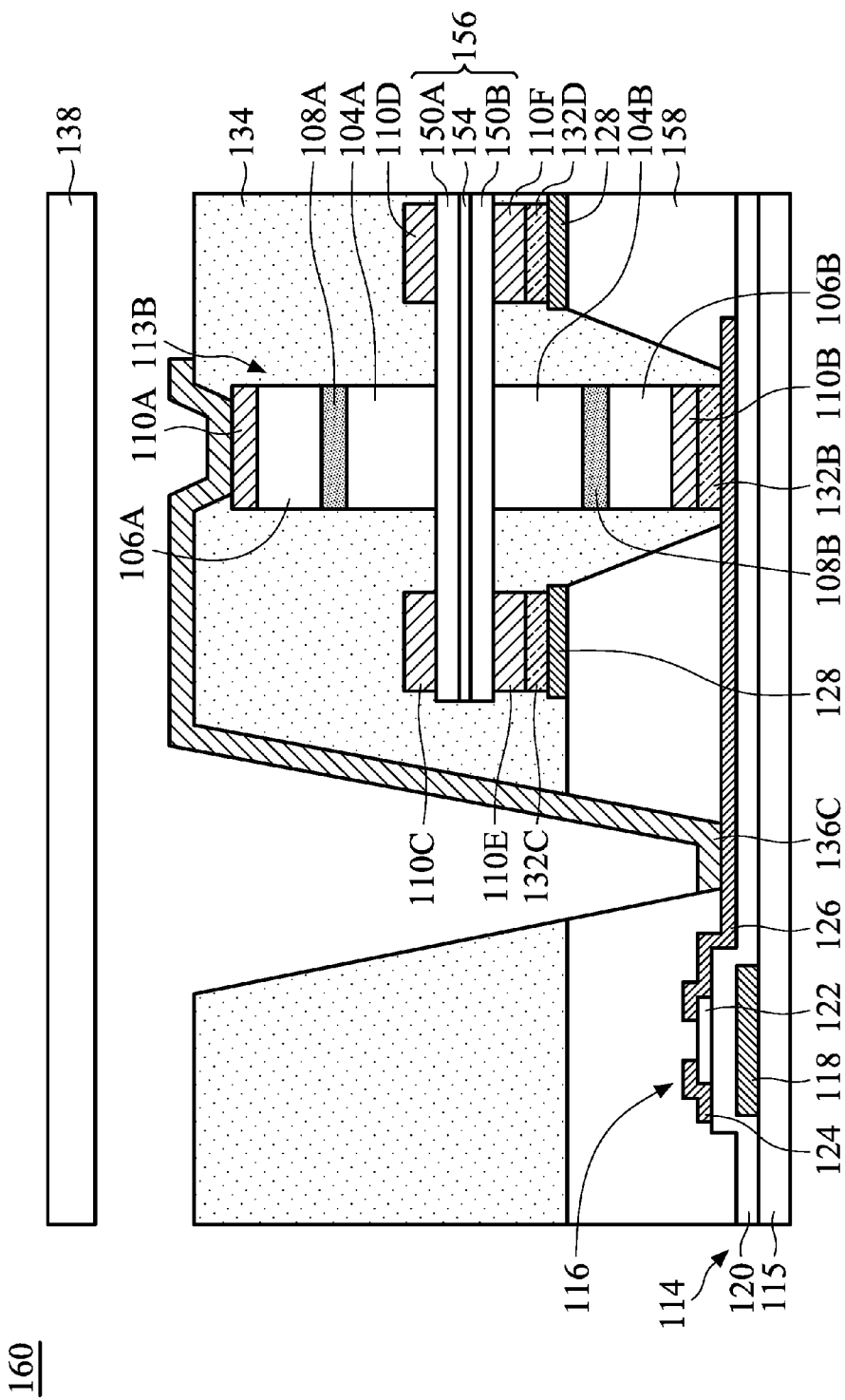
FIG. 2H is a cross-sectional view of a display device in one of the steps of a manufacturing method of the display device according to some embodiments of the present disclosure.

Subsequently, FIG. 2H is a cross-sectional view of a display device in one of the steps of a manufacturing method of the display device according to some embodiments of the present disclosure. As shown in FIG. 2H, a conductive layer 136C is formed over the patterned insulating layer 134. The conductive layer 136C may include, but is not limited to, a single layer or multiple layers of gold, chromium, nickel, platinum, titanium, aluminum, iridium, rhodium, a combination thereof, or any other metal material with good conductivity.

The first electrode 110A of the light-emitting diode 113B is electrically connected to the drain electrode 126 through the conductive layer 136C. The second electrode 110B is also electrically connected to the drain electrode 126 through the conductive binding layer 132B.

Still referring to FIG. 2H, an opposite substrate 138 may be disposed opposite the thin film transistor substrate 114 to form the display device 160. The opposite substrate 138 may include, but is not limited to, a transparent substrate, such as a glass substrate, a ceramic substrate, a plastic substrate, or any other suitable transparent substrate.

Figure 2I:
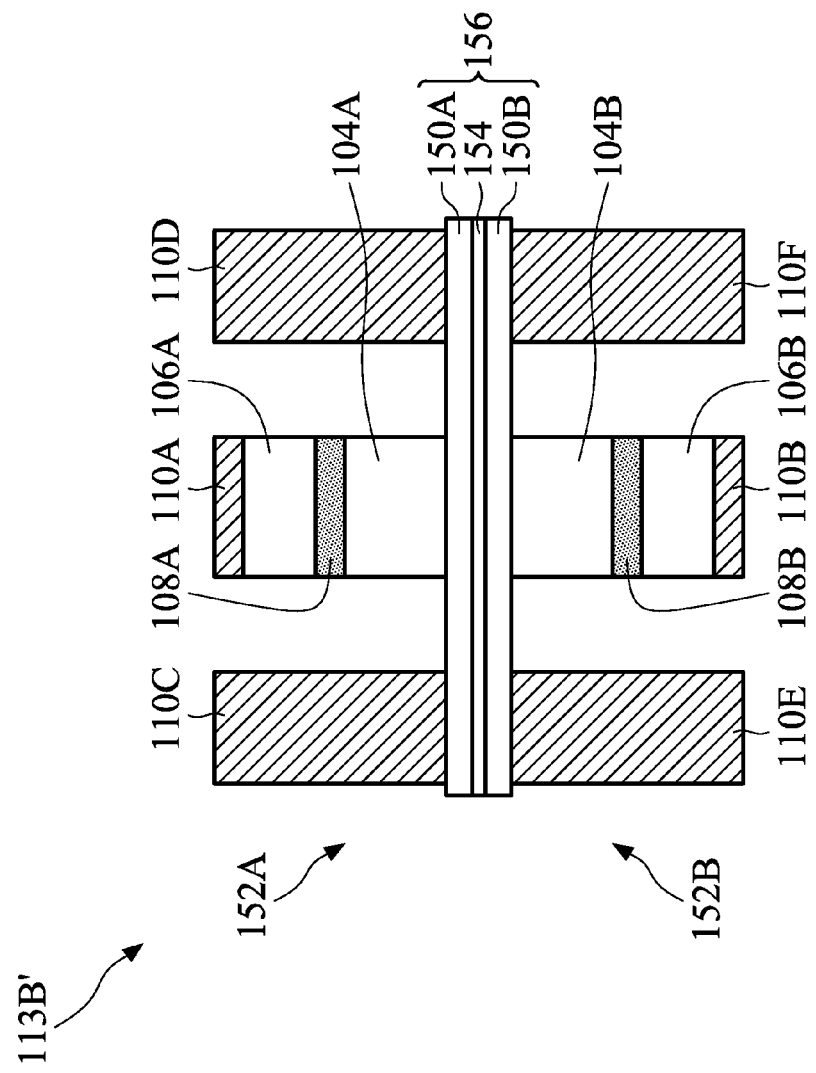
FIG. 2I is a cross-sectional view of a light-emitting diode in accordance with some other embodiments of the present disclosure.
Figure 2J:
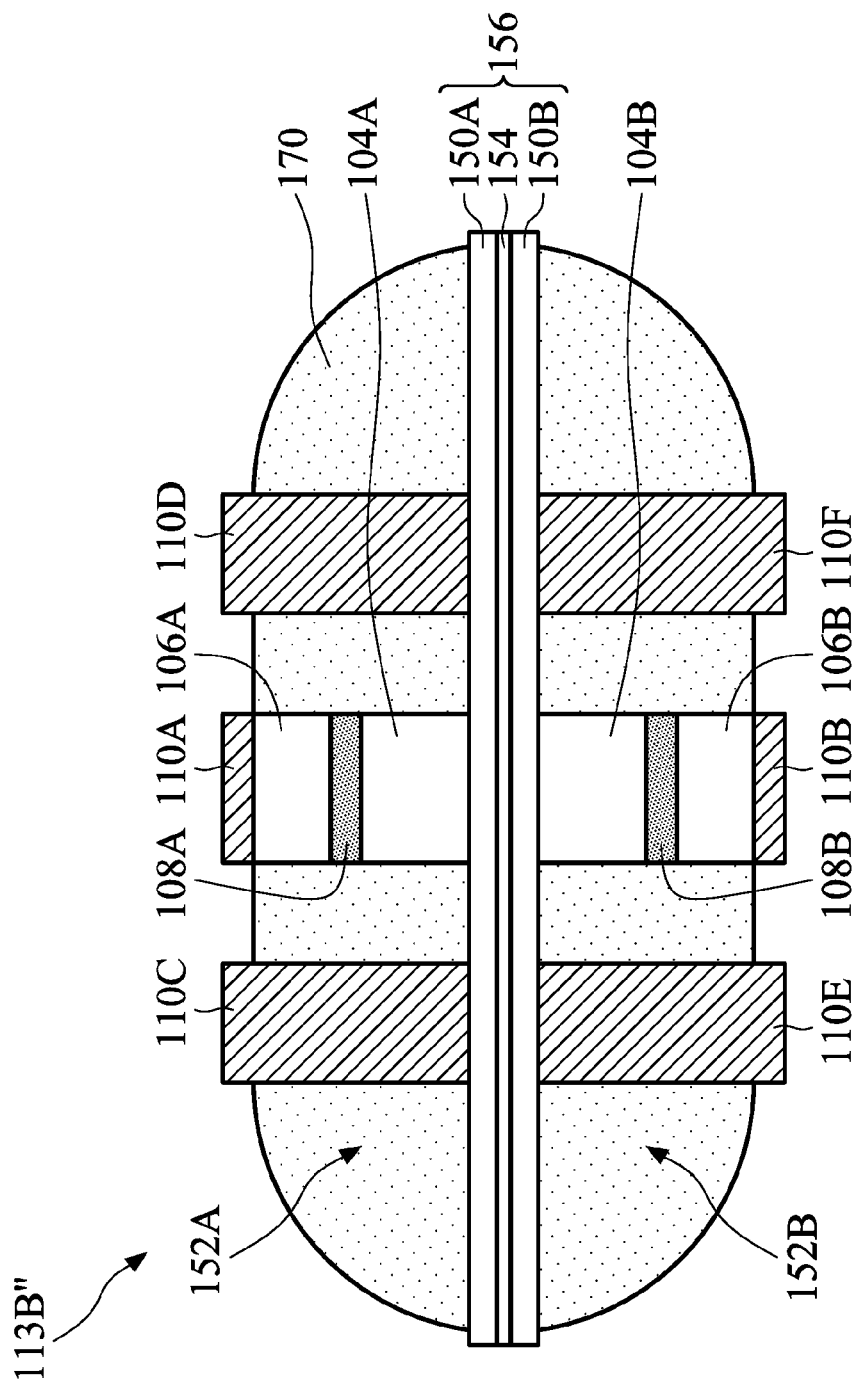
FIG. 2J is a cross-sectional view of a light-emitting diode in accordance with some other embodiments of the present disclosure.
Figure 2K:
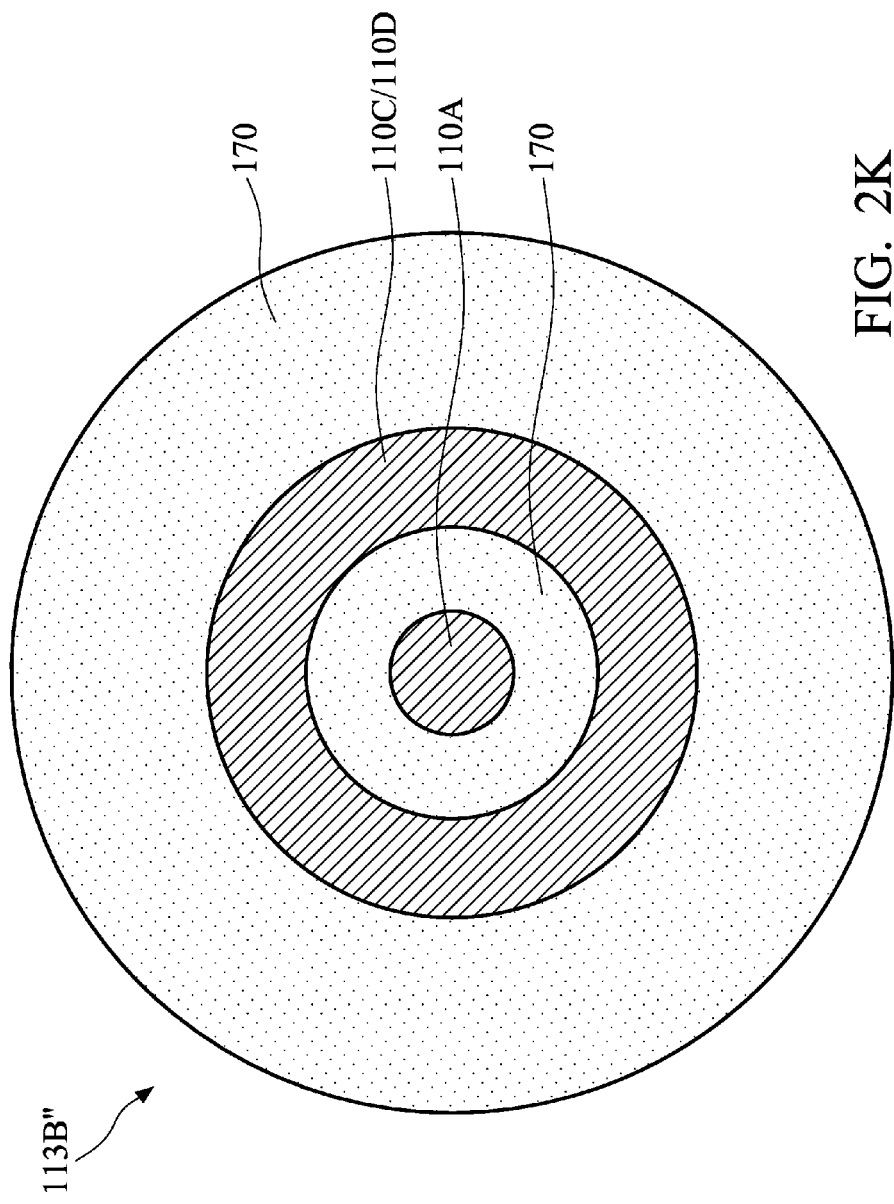
FIG. 2K is a top view of a light-emitting diode in accordance with some other embodiments of the present disclosure.

It should be noted that the exemplary embodiment set forth in FIGS. 2A-2H is merely for the purpose of illustration. In addition to the embodiment set forth in FIGS. 2A-2H, the light-emitting diode of the present disclosure may have other structure, as shown in FIGS. 2I-2K. This will be described in detail in the following description. Therefore, the inventive concept and scope are not limited to the exemplary embodiment shown in FIGS. 2A-2H.

FIG. 2I is a cross-sectional view of a light-emitting diode in accordance with some other embodiments of the present disclosure. As shown in FIG. 2I, the third electrodes 110C and 110D are disposed over the top surface of the conductive substrate 156 where the first semiconductor layer 104A does not cover. The third electrodes 110E and 110F are disposed over the bottom surface of the conductive substrate 156 where the second semiconductor layer 104B does not cover.

In addition, in some embodiments of the present disclosure, the top surfaces of the third electrodes 110C and 110D are at substantially the same horizontal level as the top surface of the first electrode 110A. And, in some embodiments, the thickness of the third electrodes 110C and 110D is greater than the thickness of the first electrode 110A. The bottom surfaces of the third electrodes 110E and 110F are at substantially the same horizontal level as the bottom surface of the second electrode 110B. And, in some embodiments, the thickness of the third electrodes 110E and 110F is greater than the thickness of the second electrode 110B.

By having the thickness of the third electrodes 110C and 110D be greater than the thickness of the first electrode 110A, and/or having the thickness of the third electrodes 110E and 110F be greater than the thickness of the second electrode 110B, the thickness of the insulating layer may be reduced, which in turn may have the light-emitting diode 113B' tend to situate at the orientation shown in FIG. 2I in the manufacturing process. Therefore, the yield of the display device may be increased.

Subsequently, FIG. 2J is a cross-sectional view of a light-emitting diode in accordance with some other embodiments of the present disclosure. FIG. 2K is a top view of the light-emitting diode shown in FIG. 2J. As shown in FIGS. 2J-2K, the light-emitting diode 113B" further includes a filling layer 170. The filling layer 170 encapsulates the top surface and bottom surface of the conductive substrate 156, the first semiconductor layer 104A, the second semiconductor layer 104B, the second semiconductor layer 106A and the third semiconductor layer 106B. In addition, the first electrode 110A, the second electrode 110B, the third electrode 110C, 110D, 110E and 110F are exposed from the filling layer 170 to ensure these electrodes may be electrically connected to the thin film transistor substrate.

The material of the filling layer 170 may include, but is not limited to, organic insulating materials (such as photosensitive resins) or inorganic insulating materials (such as silicon nitride, silicon oxide, silicon oxynitride, silicon carbide, aluminum oxide, or a combination thereof).

By using the filling layer 170 to package the light-emitting diode 113B" and make the light-emitting diode 113B" has the oval cross-section shape, the thickness of the insulating layer may be reduced, which in turn may have the light-emitting diode 113B" tend to situate at the orientation shown in FIG. 2J in the manufacturing process. Therefore, the yield of the display device may be increased.

It should be noted that the exemplary embodiment set forth in FIGS. 2A-2K is merely for the purpose of illustration. In addition to the embodiment set forth in FIGS. 2A-2K, the light-emitting diode of the present disclosure may have other structure, as shown in FIGS. 3A-3I. This will be described in detail in the following description. Therefore, the inventive concept and scope are not limited to the exemplary embodiment shown in FIGS. 2A-2K.

Note that the same or similar elements or layers corresponding to those of the semiconductor device are denoted by like reference numerals. The same or similar elements or layers denoted by like reference numerals have the same meaning and will not be repeated for the sake of brevity.

Figure 3A:
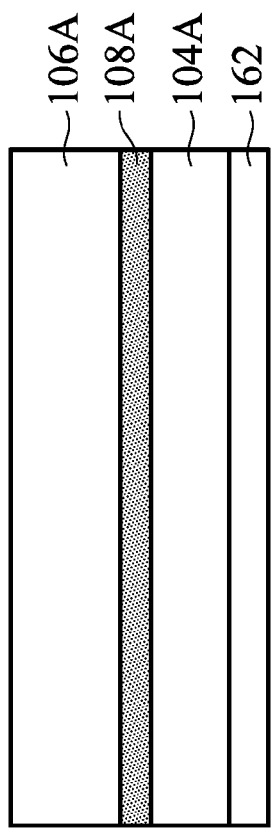
FIG. 3A is a cross-sectional view of a light-emitting diode in one of the steps of a manufacturing method of the light-emitting diode according to some embodiments of the present disclosure.

FIG. 3A is a cross-sectional view of a light-emitting diode in one of the steps of a manufacturing method of the light-emitting diode according to some embodiments of the present disclosure. As shown in FIG. 3A, a first semiconductor layer 104A, a light-emitting layer 108A and a second semiconductor layer 106A are sequentially formed over the substrate 162. The substrate 162 may include a Si substrate, a SiC substrate, a sapphire substrate (or an aluminum oxide substrate), a GaN substrate, a plastic substrate, a glass substrate or any other suitable substrates. In some embodiments of the present disclosure, the first semiconductor layer 104A has the first conductive type, and the second semiconductor layer 106A has the second conductive type. In some embodiments of the present disclosure, the first conductive type is N-type, and the second conductive type is P-type. However, the embodiments of the present disclosure are not limited thereto as long as the second conductive type is different from the first conductive type. For example, in some other embodiments of the present disclosure, the first conductive type is P-type, and the second conductive type is N-type.

Figure 3B:
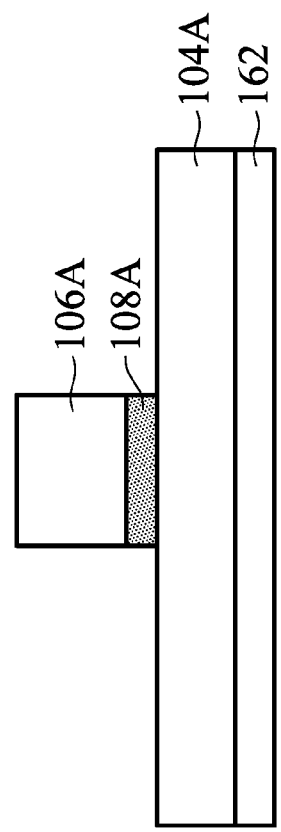
FIG. 3B is a cross-sectional view of a light-emitting diode in one of the steps of a manufacturing method of the light-emitting diode according to some embodiments of the present disclosure.

Subsequently, FIG. 3B is a cross-sectional view of a light-emitting diode in one of the steps of a manufacturing method of the light-emitting diode according to some embodiments of the present disclosure. As shown in FIG. 3B, an etching process is performed to remove a portion of the light-emitting layer 108A and second semiconductor layer 106A. And the first semiconductor layer 104A is exposed.

Figure 3C:
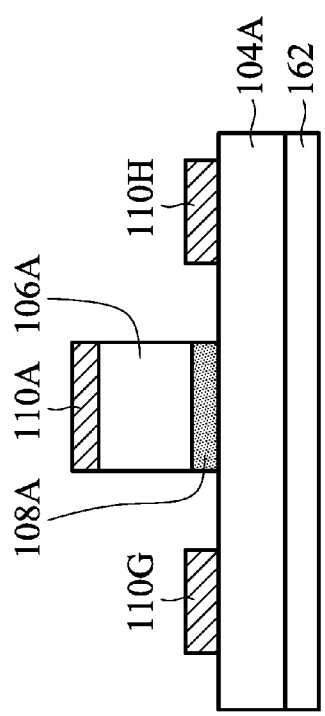
FIG. 3C is a cross-sectional view of a light-emitting diode in one of the steps of a manufacturing method of the light-emitting diode according to some embodiments of the present disclosure.

Subsequently, FIG. 3C is a cross-sectional view of a light-emitting diode in one of the steps of a manufacturing method of the light-emitting diode according to some embodiments of the present disclosure. As shown in FIG. 3C, the first electrode 110A is formed over the second semiconductor layer 106A, and the two third electrodes 110G and 110H are formed over the exposed surface of the first semiconductor layer 104A. The two third electrodes 110G and 110H are disposed at two opposite sides of the second semiconductor layer 106A, respectively. In some embodiments of the present disclosure, the two third electrodes 110G and 110H are two cross-sectional portions in one cross-sectional view of the circular third electrode 110.

Figure 3D:
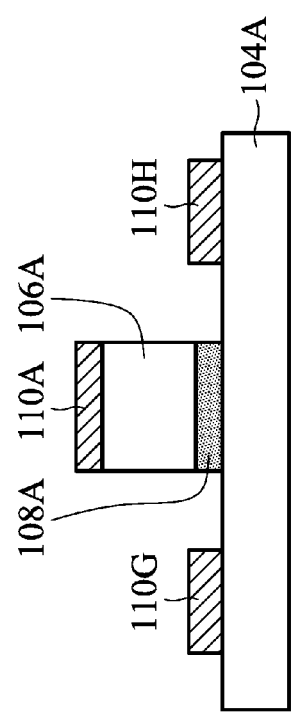
FIG. 3D is a cross-sectional view of a light-emitting diode in one of the steps of a manufacturing method of the light-emitting diode according to some embodiments of the present disclosure.

Subsequently, FIG. 3D is a cross-sectional view of a light-emitting diode in one of the steps of a manufacturing method of the light-emitting diode according to some embodiments of the present disclosure. As shown in FIG. 3D, the substrate 162 is removed and a light-emitting unit 152C is formed.

Figure 3E:
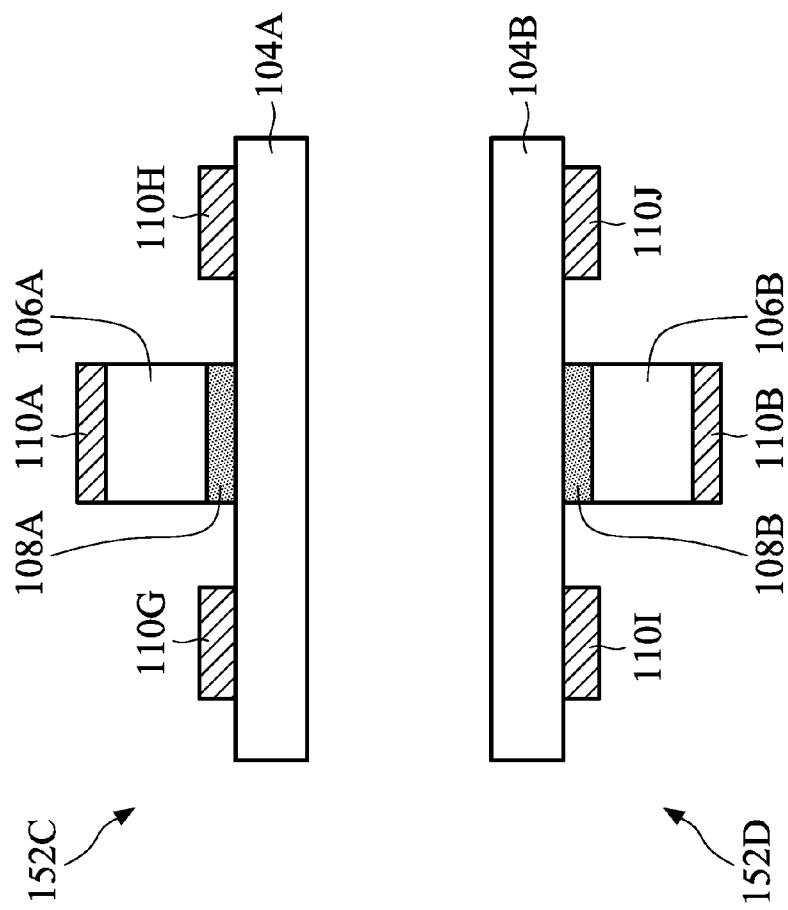
FIG. 3E is a cross-sectional view of a light-emitting diode in one of the steps of a manufacturing method of the light-emitting diode according to some embodiments of the present disclosure.
Figure 3F:
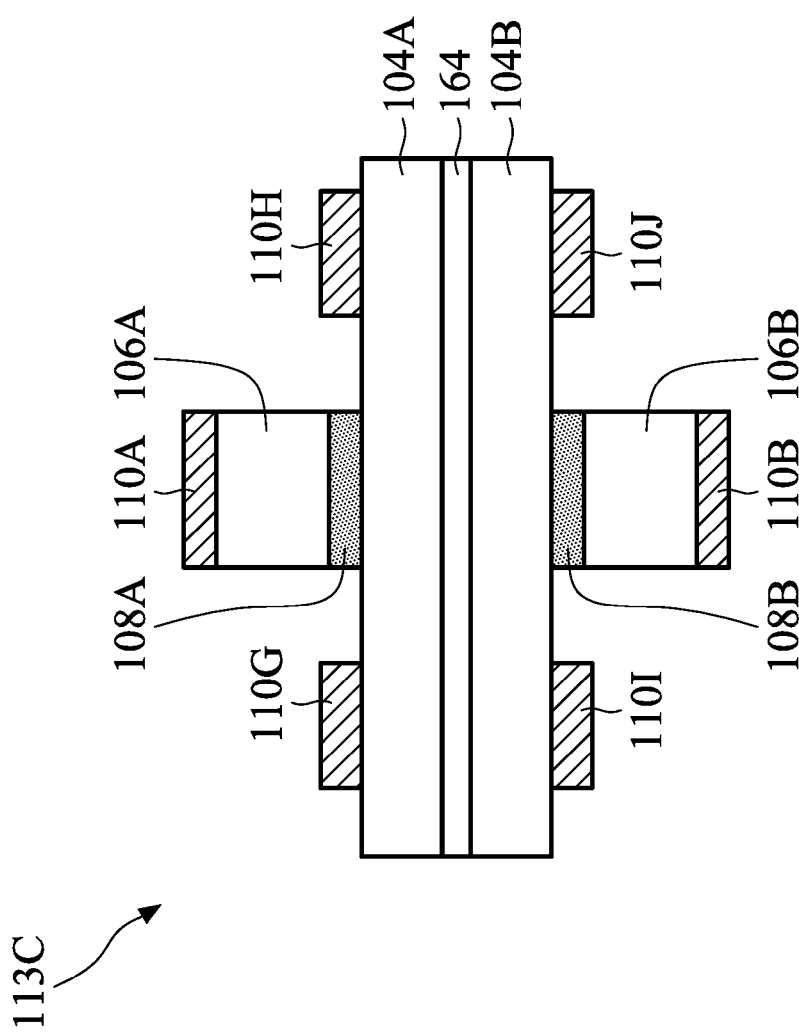
FIG. 3F is a cross-sectional view of a light-emitting diode in one of the steps of a manufacturing method of the light-emitting diode according to some embodiments of the present disclosure.

Subsequently, FIG. 3E is a cross-sectional view of a light-emitting diode in one of the steps of a manufacturing method of the light-emitting diode according to some embodiments of the present disclosure, and FIG. 3F is a cross-sectional view of a light-emitting diode in one of the steps of a manufacturing method of the light-emitting diode according to some embodiments of the present disclosure. As shown in FIG. 3E, another light-emitting unit 152D is provided. The structure of the light-emitting unit 152D is similar to the structure of the light-emitting unit 152C. The light-emitting unit 152D also includes a second semiconductor layer 104B. A light-emitting layer 108B, a third semiconductor layer 106B and a second electrode 110B are sequentially formed over the second semiconductor layer 104B. In addition, two third electrodes 110I and 110J are also disposed over the second semiconductor layer 104B. The two third electrodes 110I and 110J are disposed at two opposite sides of the third semiconductor layer 106B, respectively. In some embodiments of the present disclosure, the two third electrodes 110I and 110J are two cross-sectional portions in one cross-sectional view of the circular third electrode 110.

Next, as shown in FIG. 3F, the light-emitting unit 152C is bonded to the light-emitting unit 152D with the first semiconductor layers 104A and the second semiconductor layer 104B being opposite to each other to form a light-emitting diode 113C. The first semiconductor layer 104A is bonded to the second semiconductor layer 104B through a conductive adhesive layer 164. In other words, the conductive adhesive layer 164 is disposed between the first semiconductor layer 104A and the second semiconductor layer 104B. In some embodiments of the present disclosure, the conductive adhesive layer 164 may include copper-tin alloy. In addition, in this embodiment, the first semiconductor layer 104A, the second semiconductor layer 104B and the conductive adhesive layer 164 are collectively referred to as a first semiconductor structure.

Figure 3G:
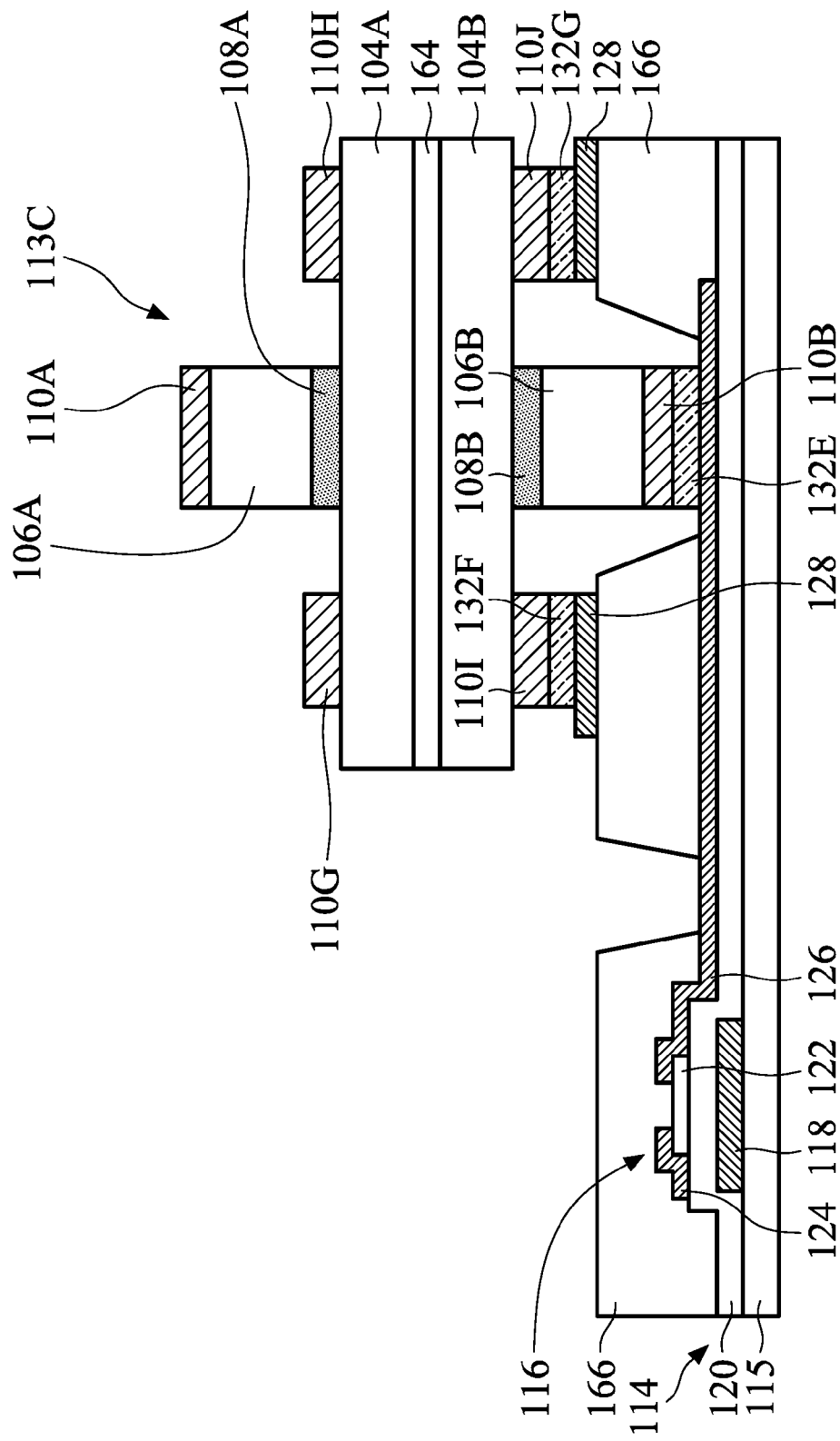
FIG. 3G is a cross-sectional view of a display device in one of the steps of a manufacturing method of the display device according to some embodiments of the present disclosure.

Subsequently, FIG. 3G is a cross-sectional view of a display device in one of the steps of a manufacturing method of the display device according to some embodiments of the present disclosure. As shown in FIG. 3G, a substrate 115 is provided. A transistor 116 which is used to control the light-emitting diode to emit light is disposed over the substrate 115. The substrate 115 with the transistor 116 disposed thereon may be a thin film transistor substrate 114.

A patterned insulating layer 166 may be further disposed over the substrate 115. The material of the patterned insulating layer 166 may include, but is not limited to, organic insulating materials (such as photosensitive resins) or inorganic insulating materials (such as silicon nitride, silicon oxide, silicon oxynitride, silicon carbide, aluminum oxide, or a combination thereof). The patterned insulating layer 166 has two openings exposing the drain electrode 126.

The second electrode 110B of the light-emitting diode 113C is bonded to the drain electrode 126 disposed over the substrate 115 through a conductive binding layer 132E. In particular, the conductive binding layer 132E is disposed between the second electrode 110B of the light-emitting diode 113C and the substrate 115 (or the drain electrode 126). The material of the conductive binding layer 132E may include solder, indium, anisotropic conductive film, conductive silver glue, or any other suitable conductive binding material, or a combination thereof.

In addition, the two third electrodes 110I and 110J are bonded to the common electrode 128 through the conductive binding layers 132F and 132G, respectively. The first semiconductor layer 104A and the second semiconductor layer 104B are electrically connected to the common electrode 128 through the third electrodes 110I and 110J, and the conductive binding layers 132F and 132G. The common electrode 128 may be electrically connected to other electrodes or electric wires through a conductive via or any other structure.

In addition, in some embodiments of the present disclosure, the conductive binding layers 132E, 132F and 132G are tin or indium. The drain electrode 126 and the common electrode 128 are double-layered structures including a nickel layer and a copper layer. The drain electrode 126 and common electrode 128 are bonded to the conductive binding layer 132E, 132F and 132G by its nickel layer. In addition, the second electrode 110B and the third electrode 110I and 110J are also double-layered structures including a nickel layer and a copper layer. And the second electrode 110B and the third electrode 110I and 110J are also bonded to the conductive binding layer 132E, 132F and 132G by its nickel layer. By using the specific metal material mentioned above, the device in the embodiments of the present disclosure may have excellent adhesion between layers.

However, in some other embodiments of the present disclosure, there is no conductive binding layer 132E disposed between the light-emitting diode 113C and the substrate 115. The second electrode 110B of the light-emitting diode 113C and the drain electrode 126 disposed over the substrate 115 may be metal with a low melting point. The second electrode 110B and the drain electrode 126 may be fused and bonded to each other by applying a certain temperature and pressure onto the second electrode 110B and the drain electrode 126. In some other embodiments of the present disclosure, there are no conductive binding layers 132F and 132G disposed between the two third electrodes 110I and 110J and the common electrode 128. The third electrodes 110I and 110J and the common electrode 128 may be metal with a low melting point. The third electrodes 110I and 110J and the common electrode 128 may be fused and bonded to each other by applying a certain temperature and pressure onto the third electrodes 110I and 110J and the common electrode 128.

Figure 3H:
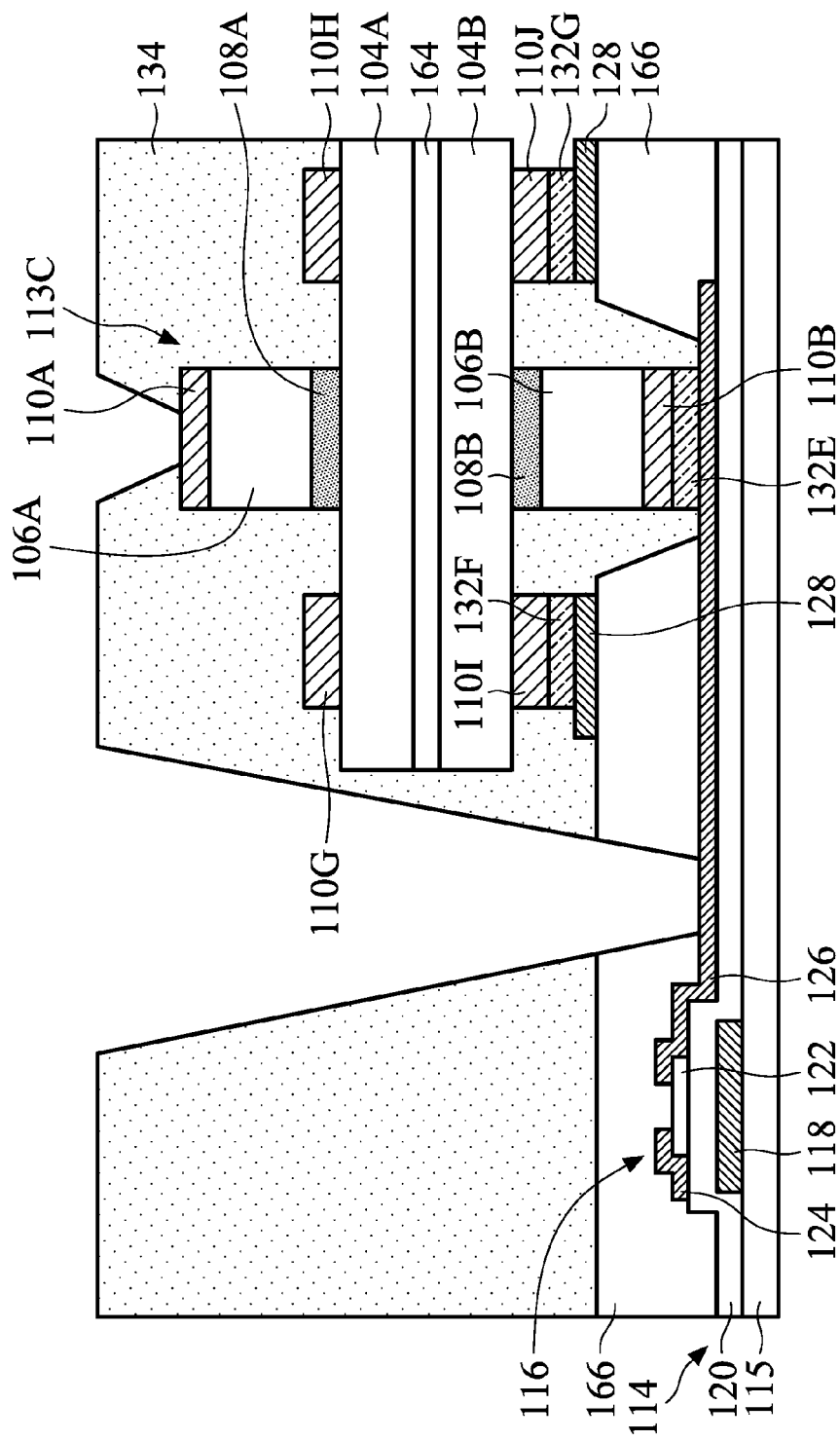
FIG. 3H is a cross-sectional view of a display device in one of the steps of a manufacturing method of the display device according to some embodiments of the present disclosure.

Subsequently, FIG. 3H is a cross-sectional view of a display device in one of the steps of a manufacturing method of the display device according to some embodiments of the present disclosure. As shown in FIG. 3H, a patterned insulating layer 134 may be formed over the light-emitting diode 113C and the thin film transistor substrate 114. The material of the patterned insulating layer 134 may include, but is not limited to, organic insulating materials (such as photosensitive resins) or inorganic insulating materials (such as silicon nitride, silicon oxide, silicon oxynitride, silicon carbide, aluminum oxide, or a combination thereof). The patterned insulating layer 134 has two openings respectively exposing the first electrode 110A and the drain electrode 126.

Figure 3I:
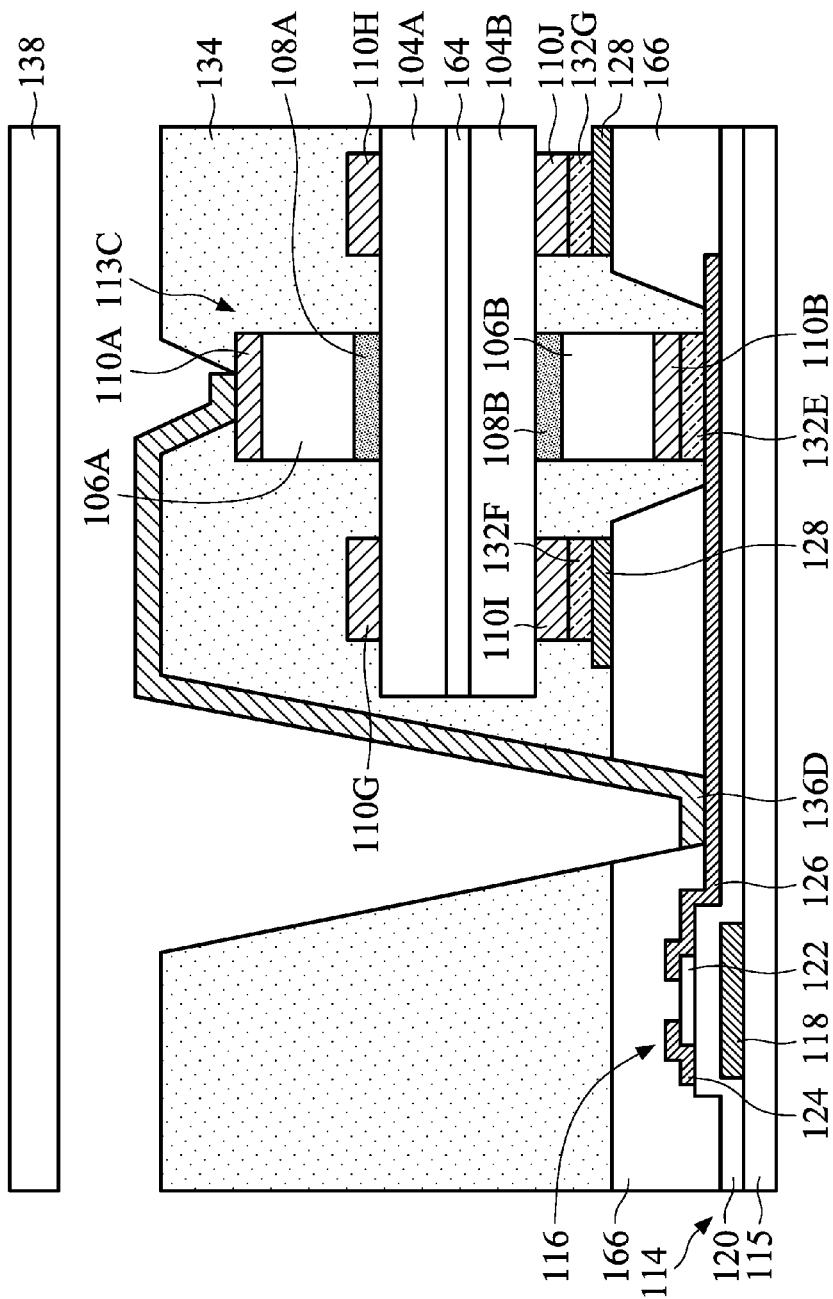
FIG. 3I is a cross-sectional view of a display device in one of the steps of a manufacturing method of the display device according to some embodiments of the present disclosure.

Subsequently, FIG. 3I is a cross-sectional view of a display device in one of the steps of a manufacturing method of the display device according to some embodiments of the present disclosure. As shown in FIG. 3I, a conductive layer 136D is formed over the patterned insulating layer 134. The conductive layer 136D may include, but is not limited to, a single layer or multiple layers of gold, chromium, nickel, platinum, titanium, aluminum, iridium, rhodium, a combination thereof, or any other metal material with good conductivity.

The first electrode 110A of the light-emitting diode 113C is electrically connected to the drain electrode 126 through the conductive layer 136D. The second electrode 110B is also electrically connected to the drain electrode 126 through the conductive binding layer 132E.

Still referring to FIG. 3I, an opposite substrate 138 may be disposed opposite the substrate 115 to form the display device 168. The opposite substrate 138 may include, but is not limited to, a transparent substrate, such as a glass substrate, a ceramic substrate, a plastic substrate, or any other suitable transparent substrate.

Figure 3J:
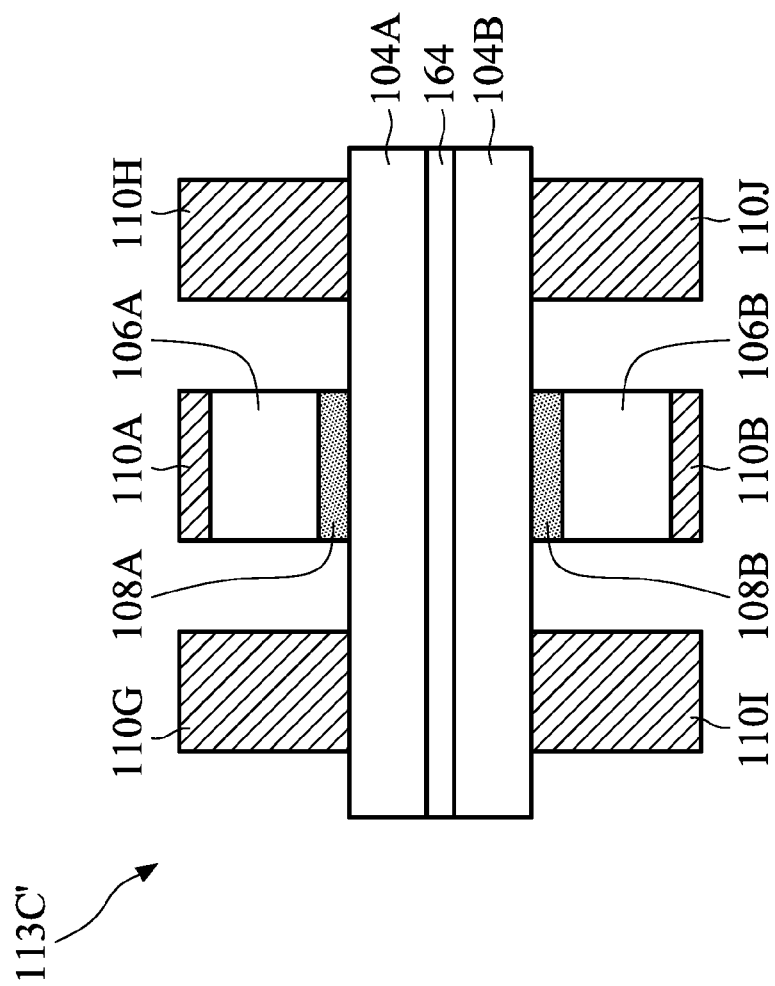
FIG. 3J is a cross-sectional view of a light-emitting diode in accordance with some other embodiments of the present disclosure.
Figure 3K:
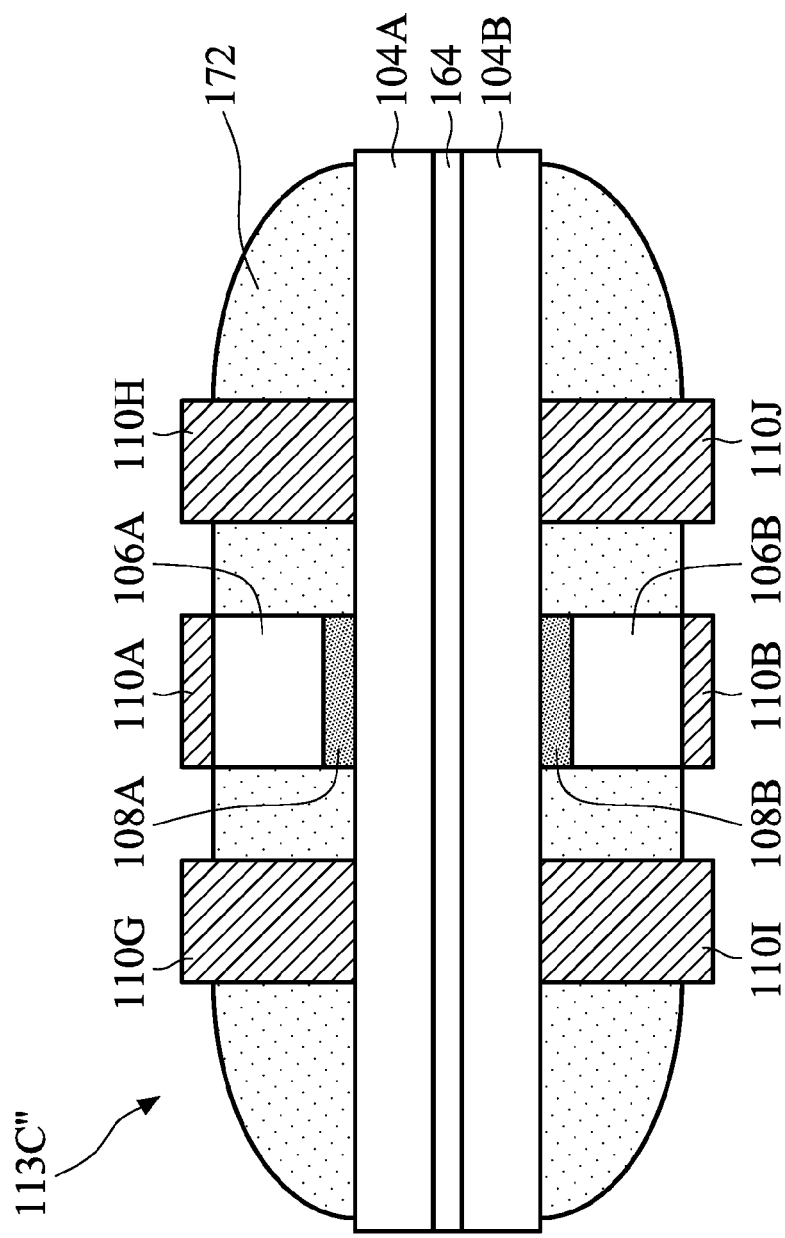
FIG. 3K is a cross-sectional view of a light-emitting diode in accordance with some other embodiments of the present disclosure.
Figure 3L:
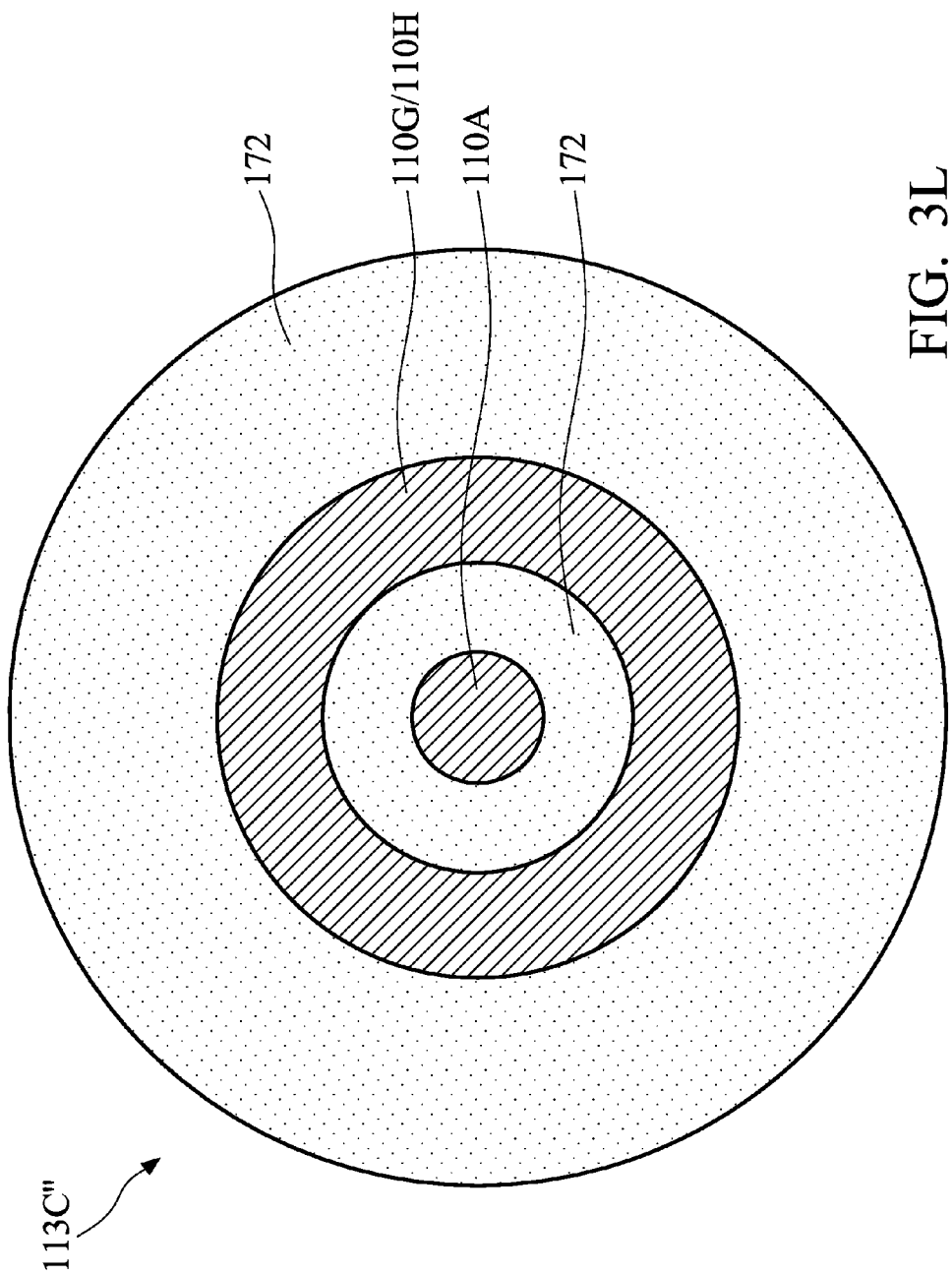
FIG. 3L is a cross-sectional view of a light-emitting diode in accordance with some other embodiments of the present disclosure.

It should be noted that the exemplary embodiment set forth in FIGS. 3A-3I is merely for the purpose of illustration. In addition to the embodiment set forth in FIGS. 3A-3I, the light-emitting diode of the present disclosure may have other structure, as shown in FIGS. 3J-3L. This will be described in detail in the following description. Therefore, the inventive concept and scope are not limited to the exemplary embodiment shown in FIGS. 3A-3I.

FIG. 3J is a cross-sectional view of a light-emitting diode in accordance with some other embodiments of the present disclosure. As shown in FIG. 3J, the third electrodes 110G and 110H are disposed over the top surface of the first semiconductor layer 104A where the second semiconductor layer 106A does not cover. The third electrodes 110I and 110J are disposed over the bottom surface of the second semiconductor layer 104B where the third semiconductor layer 106B does not cover.

In addition, in some embodiments of the present disclosure, the top surfaces of the third electrodes 110G and 110H are at substantially the same horizontal level as the top surface of the first electrode 110A. And, in some embodiments, the thickness of the third electrodes 110G and 110H is greater than the thickness of the first electrode 110A. In addition, the bottom surfaces of the third electrodes 110I and 110J are at substantially the same horizontal level as the bottom surface of the second electrode 110B. And, in some embodiments, the thickness of the third electrodes 110I and 110J is greater than the thickness of the second electrode 110B.

By having the thickness of the third electrodes 110G and 110H be greater than the thickness of the first electrode 110A, and/or having the thickness of the third electrodes 110I and 110J be greater than the thickness of the second electrode 110B, the thickness of the insulating layer may be reduced, which in turn may have the light-emitting diode 113C' tend to situate at the orientation shown in FIG. 3J in the manufacturing process. Therefore, the yield of the display device may be increased.

Subsequently, FIG. 3K is a cross-sectional view of a light-emitting diode in accordance with some other embodiments of the present disclosure. FIG. 3L is a top view of the light-emitting diode shown in FIG. 3K. As shown in FIGS. 3K-3L, the light-emitting diode 113C'' further includes a filling layer 172. The filling layer 172 encapsulates the top surface and bottom surface of the first semiconductor structure (which includes the first semiconductor layer 104A, the second semiconductor layer 104B and the conductive adhesive layer 164), the second semiconductor layer 106A, the third semiconductor layer 106B, and the third electrode 110G, 110H, 110I and 110J. In addition, the first electrode 110A, the second electrode 110B and the third electrode 110G, 110H, 110I and 110J are exposed from the filling layer 172 to ensure they may be electrically connected to the thin film transistor substrate. The material of the filling layer 172 may include, but is not limited to, organic insulating materials (such as photosensitive resins) or inorganic insulating materials (such as silicon nitride, silicon oxide, silicon oxynitride, silicon carbide, aluminum oxide, or a combination thereof).

By using the filling layer 172 to package the light-emitting diode 113C'' and make the light-emitting diode 113C'' has the oval cross-section shape, the thickness of the insulating layer may be reduced, which in turn may have the light-emitting diode 113C'' tend to situate at the orientation shown in FIG. 3K in the manufacturing process. Therefore, the yield of the display device may be increased.

In addition, it should be noted that the drain and source mentioned above in the present disclosure are switchable since the definition of the drain and source is related to the voltage connecting thereto.

In addition, although in some embodiments of the present disclosure, the first conductive type is P-type, and the second conductive type is N-type. In some other embodiments of the present disclosure, the first conductive type is N-type, and the second conductive type is P-type.

Note that the above element sizes, element parameters, and element shapes are not limitations of the present disclosure. Those skilled in the art can adjust these settings or values according to different requirements. It should be understood that the light-emitting diode and method for manufacturing the same of the present disclosure are not limited to the configurations of FIGS. 1A to 3I. The present disclosure may merely include any one or more features of any one or more embodiments of FIGS. 1A to 3I. In other words, not all of the features shown in the figures should be implemented in the light-emitting diode and method for manufacturing the same of the present disclosure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
   a thin film transistor substrate, wherein the thin film transistor substrate comprises:
   a substrate;
   a thin film transistor disposed over the substrate;
   a common electrode disposed over the substrate; and
   a light-emitting diode disposed over the substrate, wherein the light-emitting diode comprises:

a first semiconductor structure having an upper surface and a lower surface;

a second semiconductor layer disposed adjacent to the upper surface;

a third semiconductor layer disposed adjacent to the lower surface;

two light-emitting layers disposed between the upper surface and the second semiconductor layer and disposed between the lower surface and the third semiconductor layer, respectively;

a first electrode disposed over the second semiconductor layer; and a second electrode disposed over the third semiconductor layer;

wherein the first semiconductor structure of the light-emitting diode is electrically connected to one of the thin film transistor and the common electrode, and the second semiconductor layer and the third semiconductor layer are electrically connected to the other one of the thin film transistor and the common electrode.

2. The display device as claimed in claim 1, further comprising:

a conductive binding layer disposed between the light-emitting diode and the thin film transistor substrate, wherein a material of the conductive binding layer comprises:

solder, indium, anisotropic conductive film, conductive silver glue, or a combination thereof.

3. The display device as claimed in claim 1, wherein the first semiconductor structure comprises a first semiconductor layer.

4. The display device as claimed in claim 3, wherein the first semiconductor layer is P-type.

5. The display device as claimed in claim 4, wherein the second semiconductor layer and the third semiconductor layer are N-type respectively.

6. The display device as claimed in claim 1, wherein when viewed from a cross-sectional view crossing the upper surface and the lower surface, the second semiconductor layer has an edge adjacent to the upper surface and the edge having a first width, and the second semiconductor layer has another edge adjacent to the first electrode and the another edge having a second width, wherein the first width is greater than the second width.

7. The display device as claimed in claim 1, wherein the first semiconductor structure comprises:

two first semiconductor layers; and a conductive adhesive layer disposed between the two first semiconductor layers.

8. The display device as claimed in claim 7, wherein the first semiconductor structure further comprises:

two third electrodes disposed over the two first semiconductor layers respectively.

9. The display device as claimed in claim 8, wherein a thickness of each of the third electrodes is greater than a thickness of the first electrode, and the thickness of each of the third electrodes is greater than a thickness of the second electrode.

10. The display device as claimed in claim 8, wherein the light-emitting diode further comprises a filling layer encapsulating the first semiconductor structure, the second semiconductor layer, the third semiconductor layer and the two third electrodes.

11. The display device as claimed in claim 10, wherein the two third electrodes are exposed from the filling layer.

12. The display device as claimed in claim 1, wherein the first semiconductor structure comprises a first semiconductor layer, and the first semiconductor layers are N-type, and the second semiconductor layer and the third semiconductor layer are P-type.

13. The display device as claimed in claim 1, wherein the first semiconductor structure comprises:

a conductive substrate having two opposite surfaces; and two first semiconductor layers disposed adjacent to the two opposite surfaces of the conductive substrate respectively.

14. The display device as claimed in claim 13, wherein the conductive substrate further comprises:

a first sub-substrate;

a second sub-substrate; and a conductive adhesive layer disposed between the first sub-substrate and the second sub-substrate.

15. The display device as claimed in claim 13, wherein the first semiconductor structure further comprises:

two third electrodes disposed adjacent to the two opposite surfaces of the conductive substrate respectively.

16. The display device as claimed in claim 15, wherein a thickness of each of the third electrodes is greater than a thickness of the first electrode, and the thickness of each of the third electrodes is greater than a thickness of the second electrode.

17. The display device as claimed in claim 15, wherein the light-emitting diode further comprises a filling layer encapsulating the first semiconductor structure, the second semiconductor layer, the third semiconductor layer and the two third electrodes.

18. The display device as claimed in claim 17, wherein the two third electrodes are exposed from the filling layer.

* * * * *